(12) United States Patent
Masuda

(10) Patent No.: US 9,984,612 B2
(45) Date of Patent: May 29, 2018

(54) IMAGE DISPLAY DEVICE

(71) Applicant: Sharp Kabushiki Kaisha, Sakai, Osaka (JP)

(72) Inventor: Junichi Masuda, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 0 days. days.

(21) Appl. No.: 15/305,185

(22) PCT Filed: Apr. 28, 2015

(86) PCT No.: PCT/JP2015/062817
§ 371 (c)(1),
(2) Date: Oct. 19, 2016

(87) PCT Pub. No.: WO2015/174276
PCT Pub. Date: Nov. 19, 2015

(65) Prior Publication Data
US 2017/0169749 A1  Jun. 15, 2017

(30) Foreign Application Priority Data

May 12, 2014 (JP) .................................. 2014-098818

(51) Int. Cl.
*G09G 3/20* (2006.01)
*G09G 3/3208* (2016.01)
(Continued)

(52) U.S. Cl.
CPC .......... *G09G 3/2003* (2013.01); *G02B 6/0043* (2013.01); *G02B 6/0068* (2013.01);
(Continued)

(58) Field of Classification Search
CPC .. G09G 3/3473; G09G 3/3413; G02B 6/0043; H01L 27/322
See application file for complete search history.

(56) References Cited

U.S. PATENT DOCUMENTS 9,633,607 B1 * 4/2017 Aubert ................. G09G 3/2003
2006/0197735 A1 * 9/2006 Vuong ................. G09G 3/3406
345/102
(Continued)

FOREIGN PATENT DOCUMENTS

JP 2007-121625 A 5/2007
JP 2011-053468 A 3/2011
(Continued)

OTHER PUBLICATIONS

International Search Report PCT/ISA/210 for International Application No. PCT/JP2015/062817 dated Jul. 9, 2015.
Written Opinion of the International Searching Authority PCT/ISA/237 for International Application No. PCT/JP2015/062817 dated Jul. 9, 2015.

*Primary Examiner* — Kevin M Nguyen
(74) *Attorney, Agent, or Firm* — ScienBiziP, P.C.

(57) ABSTRACT

Provided is an image display device having a see-through-type display capable of suppressing decrease in visibility when background is visually recognized through a screen. The liquid crystal panel is driven such that chromaticity and a color temperature of source light are approximated to chromaticity and a color temperature of ambient light that have been measured by a color illuminance sensor attached to the display, the source light being transmitted through a region through which the ambient light is originally to be transmitted and having luminance lower than luminance of source light emitted from the light source. With this, in a region through which background of the liquid crystal panel can be seen, transparency seems to be increased and a viewer is able to see the background more easily.

9 Claims, 18 Drawing Sheets

(51) Int. Cl.
  *G09G 3/34* (2006.01)
  *G09G 3/36* (2006.01)
  *G02F 1/1335* (2006.01)
  *F21V 8/00* (2006.01)
  *H01L 27/32* (2006.01)

(52) U.S. Cl.
  CPC ..... *G02F 1/133536* (2013.01); *G09G 3/3208* (2013.01); *G09G 3/3413* (2013.01); *G09G 3/36* (2013.01); *H01L 27/322* (2013.01); *H01L 27/3227* (2013.01); *H01L 27/3244* (2013.01); *G02F 2203/09* (2013.01); *G09G 2310/0237* (2013.01); *G09G 2320/0626* (2013.01); *G09G 2320/0666* (2013.01); *G09G 2360/144* (2013.01)

(56) References Cited

U.S. PATENT DOCUMENTS

| | | |
|---|---|---|
| 2010/0289727 A1 | 11/2010 | Miller et al. |
| 2011/0050727 A1 | 3/2011 | Mukawa |
| 2014/0240642 A1* | 8/2014 | Furukawa .......... H05B 33/0857 349/65 |

FOREIGN PATENT DOCUMENTS

| | | |
|---|---|---|
| JP | 2012-527011 A | 11/2012 |
| JP | 2013-041099 A | 2/2013 |
| JP | 2013-171074 A | 9/2013 |
| JP | 2013-174708 A | 9/2013 |

* cited by examiner

Fig. 14
(a)
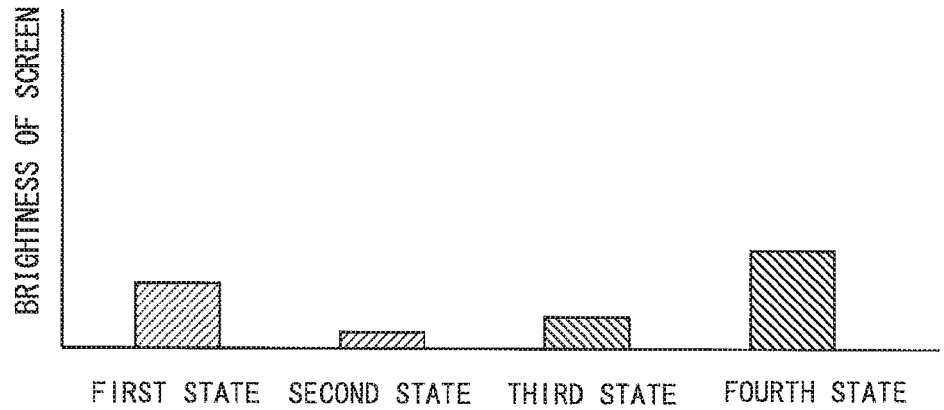
(b)
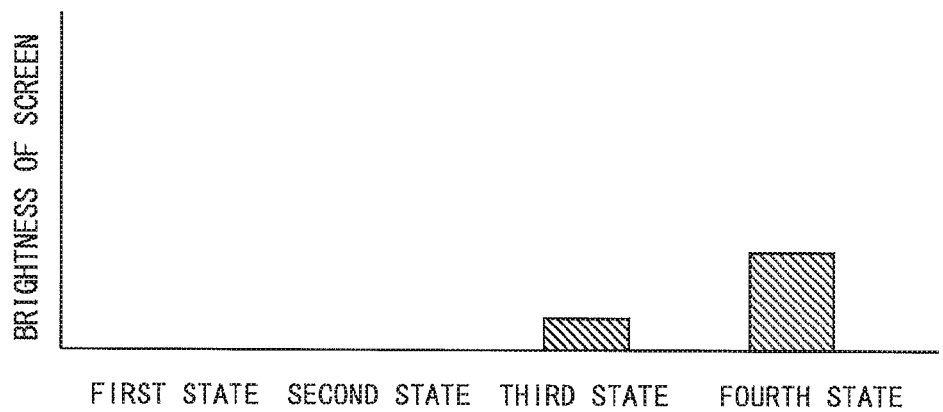
(c)
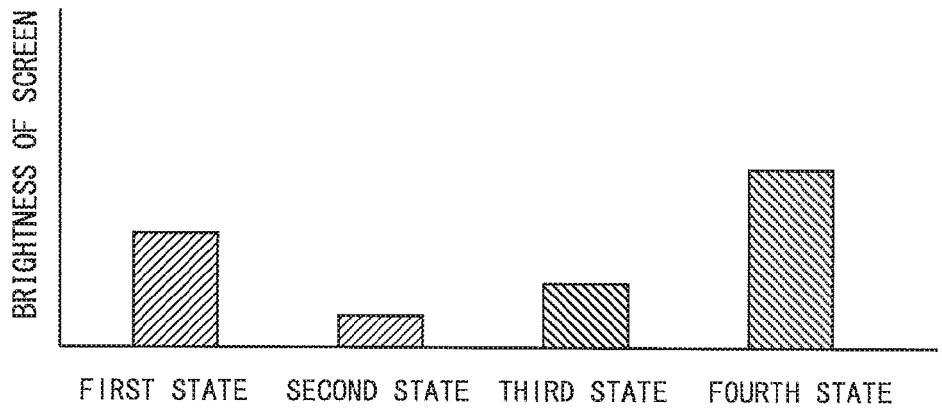

Fig. 16
(a)
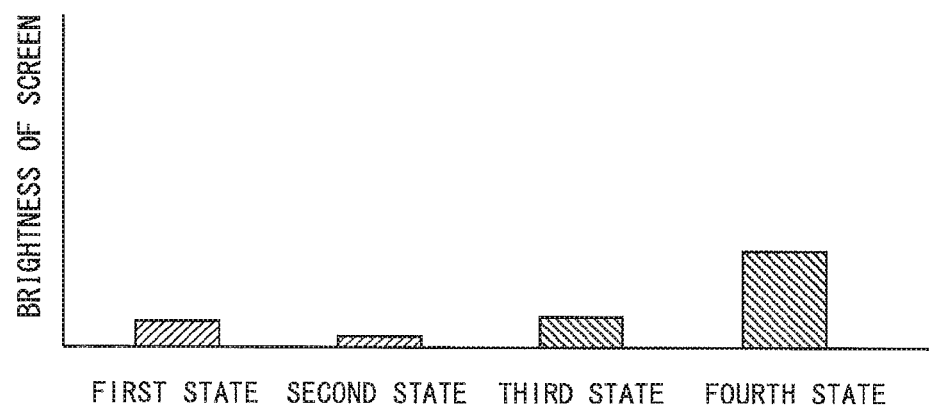
(b)
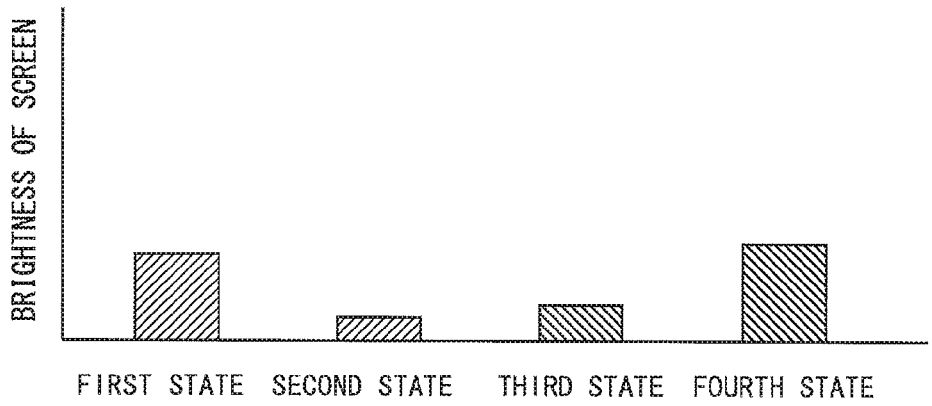

Fig. 19
(a)
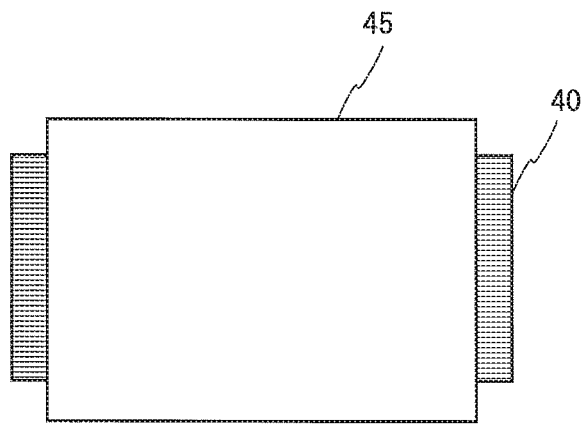
(b)
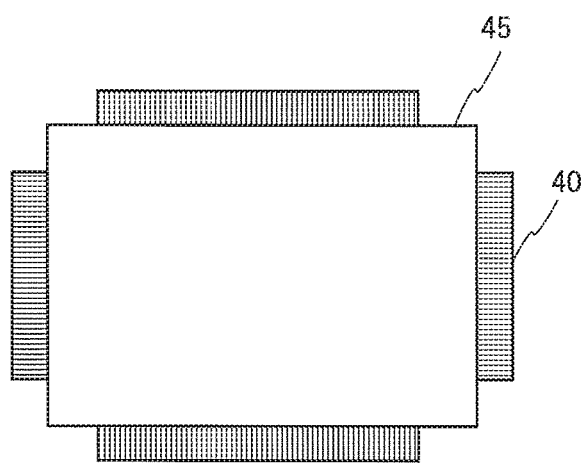
(c)
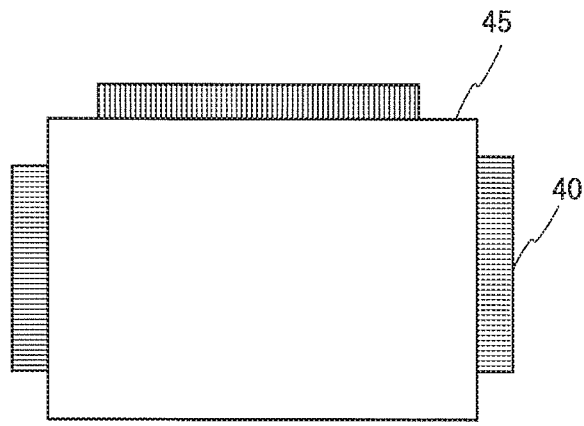

IMAGE DISPLAY DEVICE

TECHNICAL FIELD

The present invention relates to an image display device, in particular to an image display device having a see-through-type display through which background can be seen.

BACKGROUND ART

In recent years, development of a display technology called a see-through display (transparent display) that not only an image is displayed on a screen but also an object on the background of the display can be visually recognized through the screen has been actively promoted. In order to achieve a see-through display, various approaches have been proposed such as an approach in which a liquid crystal panel or an organic EL (Electro-Luminescence) panel is used. For example, a display described in Patent Document 1 includes a translucent panel and a transmittance varying unit disposed on a back surface side of the panel to face the panel. When an image and a character are displayed on a display screen of this panel, transmittance of a character area including the character displayed on the display screen in the transmittance varying unit is set to be higher than transmittance of an image area including the image. This suppresses decrease in visibility of a display content. Further, Patent Document 2 describes a display that adjusts luminance of light from a backlight, when external brightness changes, based on illuminance measured by an illuminance sensor.

PRIOR ART DOCUMENTS

Patent Documents

[Patent Document 1] Japanese Patent Application Laid-Open No. 2013-41099
[Patent Document 2] Japanese Patent Application Laid-Open No. 2013-174708

SUMMARY OF THE INVENTION

Problems to be Solved by the Invention

However, in a case of a see-through display using a liquid crystal panel or an organic EL panel, transmittance of a screen is about 20% to 30% when a normally-white-type liquid crystal panel is used as a display, and about 50% when an organic EL panel is used. Accordingly, when background is seen through the screen of the see-through-type display, brightness of background decreases considerably, as compared to a case in which the background is seen directly without through the screen. Further, ambient light is influenced by the color of the liquid crystal panel as the light is transmitted through the liquid crystal panel, and chromaticity and a color temperature of the ambient light vary from chromaticity and a color temperature on the background. As a result, a viewer has more difficulty in obtaining a sense of transparency. As described above, when background is seen through a see-through-type display, visibility decreases due to decrease in brightness on the background and difficulty in obtaining a sense of transparency.

The display described in Patent Document 1 does not take an influence of ambient light into account. Therefore, when luminance of external light changes, background that is seen through the screen is also influenced, and visibility decreases. The display described in Patent Document 2 takes an influence of external light into account, but a color of an object visually recognized by the viewer is not corrected. Accordingly, the viewer has more difficulty in obtaining a sense of transparency when the viewer visually recognizes the background through the screen, as the chromaticity and the color temperature of the ambient light that is transmitted through the screen and is influenced by the color of the display vary from the chromaticity and the color temperature before transmission through the screen.

Thus, an object of the present invention is to provide an image display device having a see-through-type display capable of suppressing decrease in visibility when background is visually recognized through a screen.

Means for Solving the Problems

A first aspect of the present invention is directed to an image display device having a display capable of providing transparent display through which background can be seen, the device comprising:
a light source configured to emit source light;
an image display unit configured to display an image by transmitting the source light emitted from the light source based on an image signal externally supplied to display the image, and capable of displaying background by transmitting ambient light entering from a back side;
an ambient light measuring sensor attached to the display, and capable of at least measuring chromaticity and a color temperature of the ambient light; and
a drive control unit configured to drive the image display unit, wherein
the drive control unit controls the image display unit such that chromaticity and a color temperature of source light are respectively approximated to the chromaticity and the color temperature of the ambient light that have been measured by the ambient light measuring sensor, the source light being transmitted through a region through which the ambient light is originally to be transmitted and having luminance lower than luminance of source light emitted from the light source when the image is displayed.

According to a second aspect of the present invention, in the first aspect of the present invention, wherein
the ambient light measuring sensor is further capable of measuring illuminance of the ambient light, and
the drive control unit controls the image display unit such that luminance of the source light in a second state is approximated to luminance of the ambient light in a fourth state within a range in which luminance in a first state, the luminance in the second state, luminance in a third state, and the luminance in the fourth state satisfy an expression (1), the first state being for transmitting only the source light, the second state being for transmitting a part of the source light through the region through which only the ambient light is originally to be transmitted, the third state being for transmitting only the ambient light, and the fourth state being for allowing direct visual recognition of the ambient light, where $$\text{fourth state} > \text{first state} > (\text{second state} + \text{third state}) \quad (1).$$

According to a third aspect of the present invention, in the first aspect of the present invention, wherein
the drive control unit turns off the light source when the motion detector does not detect presence of the viewer, and turns on the light source to be in a slight light emission state when the motion detector detects presence of the viewer.

According to a fourth aspect of the present invention, in the second aspect of the present invention, wherein the image display unit includes: a liquid crystal panel; an absorption-type polarizing plate disposed on a front side of the liquid crystal panel; and a reflection-type polarizing plate disposed on a back side of the liquid crystal panel, the light source is a light-guiding plate disposed between the liquid crystal panel and the reflection-type polarizing plate, and having an edge light attached on an end of the light-guiding plate, the light-guiding plate irradiates the reflection-type polarizing plate with source light emitted from the light source, the reflection-type polarizing plate reflects a polarization component of the source light having a polarizing direction identical to a direction of a reflection axis, and transmits a polarization component of the ambient light having a polarizing direction identical to a direction of a transmission axis to irradiate the liquid crystal panel with the transmitted light, and the drive control unit drives the liquid crystal panel by correcting a constant calculated considering components of the image display unit such that chromaticity and a color temperature of the source light in the second state are respectively approximated to chromaticity and a color temperature of the ambient light in the fourth state.

According to a fifth aspect of the present invention, in the fourth or second aspect of the present invention, wherein the drive control unit drives the light source by correcting a constant calculated considering the components of the image display unit such that the luminance of the source light in the first state is approximated to the luminance of the ambient light of the fourth state within the range in which the expression (1) is satisfied.

According to a sixth aspect of the present invention, in the fourth aspect of the present invention, wherein directions of transmission axes of the absorption-type polarizing plate, the liquid crystal panel, and the reflection-type polarizing plate are adjusted such that the ambient light entering the reflection-type polarizing plate from a back side is transmitted to a front side of the absorption-type polarizing plate when the absorption-type polarizing plate is viewed from the front side when the liquid crystal panel and the light source are in an off state.

According to a seventh aspect of the present invention, in the fifth aspect of the present invention, wherein the light-guiding plate is provided with one or more edge lights, and the one or more edge lights emit source light into the light-guiding plate, and irradiate an object positioned on the back side of the image display device with a part of the source light.

According to an eighth aspect of the present invention, in the fifth or second aspect of the present invention, wherein the light-guiding plate is provided with a plurality of edge lights, and the plurality of edge lights are disposed on ends of the light-guiding plate so as to face each other, and the plurality of edge lights emit source light into the light-guiding plate, and irradiate an object positioned on the back side of the image display device with a part of the source light.

According to a ninth aspect of the present invention, in the second aspect of the present invention, wherein the image display unit is an organic EL panel having a plurality of pixels each emitting light of a light intensity according to the image signal, and the drive control unit drives the organic EL panel by correcting a constant calculated considering components of the organic EL panel such that chromaticity and a color temperature of source light are respectively approximated to the chromaticity and the color temperature of the ambient light that have been measured by the ambient light measuring sensor, the source light being transmitted through the pixels through which the ambient light is originally to be transmitted and having luminance lower than luminance of source light emitted from the pixels when the image is displayed.

According to a tenth aspect of the present invention, in the ninth aspect of the present invention, wherein the drive control unit drives the light source by correcting a constant calculated considering the components of the organic EL panel such that the luminance of the source light in the first state is approximated to the luminance of the ambient light of the fourth state within the range in which the expression (1) is satisfied.

Effects of the Invention

According to the first aspect of the present invention, the image display unit is driven such that chromaticity and a color temperature of source light are approximated to chromaticity and a color temperature of ambient light that have been measured by the ambient light measuring sensor attached to the display, the source light being transmitted through the region through which the ambient light is originally to be transmitted and having luminance lower than luminance of source light emitted from the light source. While the region through which background can be seen of the image display unit is conventionally seen less transparent due to the color of the image display unit, transparency seems to be increased by the above driving, and the viewer is able to see the background more easily.

According to the second aspect of the present invention, the image display unit is controlled such that the luminance of the source light in the second state is approximated to the luminance of the ambient light in the fourth state within the range in which the expression (1) is satisfied. With this, it is possible to increase the luminance of the source light to display a bright image. Therefore, the viewer is able to visually recognize an image with easily viewable brightness.

According to the third aspect of the present invention, the light source is turned off when there is no viewer nearby, and the light source is made to emit slight light when the motion detector detects a viewer. In this manner, only when there is any viewer nearby, the differences of the chromaticity and the color temperature of the background that is transmitted through the image display unit are adjusted, or the luminance of the source light is adjusted. With this, it is possible to reduce power consumption of the image display device.

According to the fourth aspect of the present invention, the drive control unit drives the liquid crystal panel included in the image display unit by correcting a constant calculated considering the components of the image display unit such that chromaticity and a color temperature of the source light in the second state are approximated to chromaticity and a color temperature of the ambient light in the fourth state. With this, similarly to the case of the first aspect, transparency of the image display unit seems to be increased, and the viewer is able to see the background more easily.

According to the fifth aspect of the present invention, the drive control unit drives the light source by correcting a constant calculated considering the components of the image display unit such that the luminance of the source light in the first state is approximated to the luminance of the ambient light of the fourth state within the range in which the expression (1) is satisfied. With this, similarly to the case of the second aspect, it is possible to display an image with easily viewable brightness, and the viewer is able to visually recognize the image more easily.

According to the sixth aspect of the present invention, as the direction of the transmission axis of the absorption-type polarizing plate, the liquid crystal panel, and the reflection-type polarizing plate is adjusted, the ambient light entering the reflection-type polarizing plate is transmitted to the front side of the absorption-type polarizing plate when the liquid crystal panel and the light source are in the off state. With this, even when the liquid crystal panel and the light source are in the off state, the viewer is able to visually recognize the background.

According to the seventh aspect of the present invention, the edge lights attached to the end of the light-guiding plate emit source light within the light-guiding plate, and irradiate an object positioned on the back side of the image display device with a part of the source light. As this increases the luminance of the ambient light applied to the object, the luminance of the source light that satisfies the expression (1) also increases, and it is possible to display a bright image. Therefore, the viewer is able to visually recognize an image more easily.

According to the eight aspect of the present invention, the plurality of edge lights are disposed on ends of the light-guiding plate so as to face each other, and the plurality of edge lights irradiate an object positioned on the back side of the image display device with a part of the source light. As the edge lights are disposed so as to face each other, the part of the source light applied to the object is applied evenly to the object. With this, the brightness of the object becomes even, and the viewer is able to visually recognize the image with even brightness.

According to the ninth aspect of the present invention, when the image display unit is the organic EL panel having the plurality of pixels that emit light of a light intensity according to the image signal, similarly to the case in the fourth aspect, the organic EL panel is driven based on correction of a constant calculated considering the components of the organic EL panel such that the chromaticity and the color temperature of the source light in the second state are approximated to the chromaticity and the color temperature of the ambient light in the fourth state. With this, it is possible to achieve the same effects as the fourth aspect described above.

According to the tenth aspect of the present invention, when the image display unit is the organic EL panel having the plurality of pixels that emit light of a light intensity according to the image signal, the light source is driven based on correction of a constant calculated considering the components of the organic EL panel such that the luminance of the source light in the first state is approximated to the luminance of the ambient light of the fourth state within the range in which the expression (1) is satisfied. With this, it is possible to achieve the same effects as the fifth aspect described above.

BRIEF DESCRIPTION OF THE DRAWINGS

FIG. 14 shows charts showing brightness of a screen in the first state to the fourth state shown in FIG. 7 through FIG. 10, and more specifically, FIG. 14(a) shows the brightness of the screen in each of the states when the light source is turned to the on state in a case where a measured value of illuminance of the ambient light is low, FIG. 14(b) shows the brightness of the screen in each of the states when the light source is turned to the off state, and FIG. 14(c) shows the brightness of the screen in each of the states when the light source is turned to the on state in a case where a measured value of illuminance of the ambient light is high.

FIG. 16 shows charts showing brightness of a screen in the first state to the fourth state when the light source is made to emit slight light in the image display device illustrated in FIG. 15, and more specifically, FIG. 16(a) shows the brightness of the screen in the first state to the fourth state before the source light is adjusted, and FIG. 16(b) shows the brightness of the screen in the first state to the fourth state after the source light is adjusted.

FIG. 19 shows diagrams each illustrating a light-guiding plate to which light sources are attached in the image display device illustrated in FIG. 18, and more specifically, FIG. 19(a) shows a light-guiding plate having light sources respectively attached to a left end and a right end, FIG. 19(b) shows a light-guiding plate having light sources respectively attached to an upper end and a lower end, and FIG. 19(c) shows a light-guiding plate having light sources respectively attached to a left end, a right end, an upper end, and a lower end.

MODES FOR CARRYING OUT THE INVENTION

1. First Embodiment

<1.1 General Study>

Figure 1:
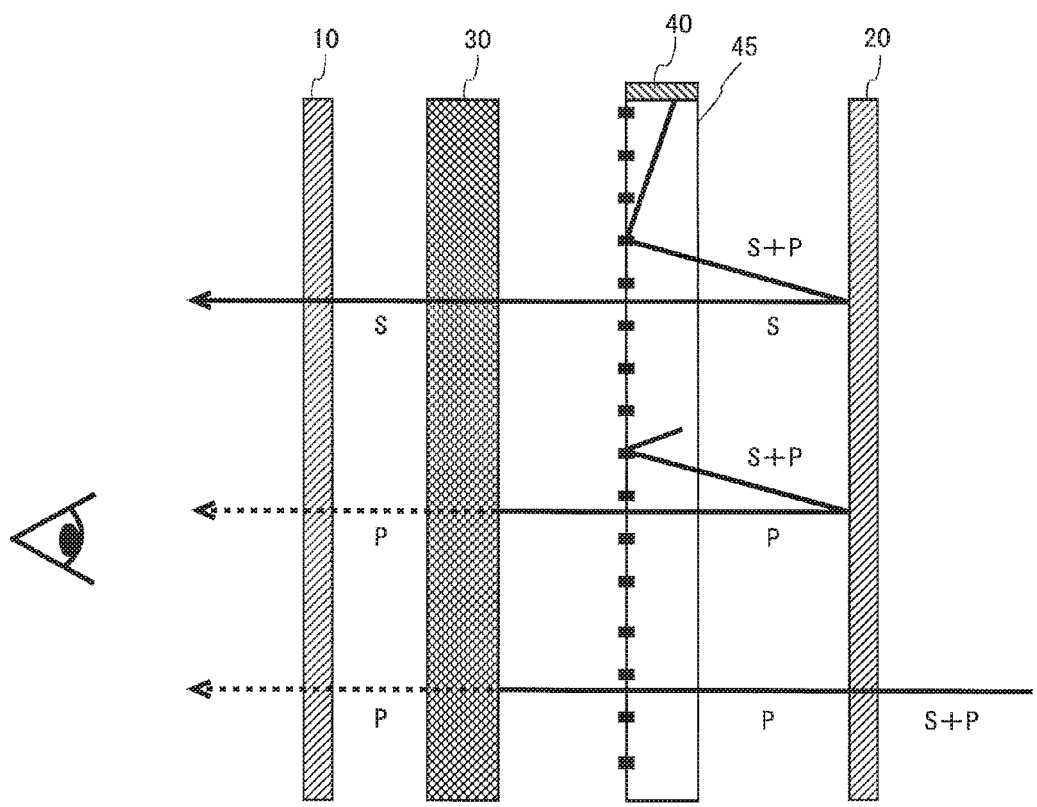
FIG. 1 is a diagram illustrating transmission paths, in a see-through-type display of an image display device, of source light emitted from a light-guiding plate and ambient light entering from a back side of the display.

FIG. 1 is a diagram illustrating transmission paths, in a see-through-type display of an image display device, of source light emitted from a light-guiding plate 45 and ambient light entering from a back side of the display. As illustrated in FIG. 1, in the image display device, an absorption-type polarizing plate 10, a liquid crystal panel 30, the light-guiding plate 45 having a light source 40, and a reflection-type polarizing plate 20 are arranged in parallel with each other from a display side to a back side. In FIG. 1, a direction of a reflection axis and a direction of a transmission axis of the reflection-type polarizing plate 20 are respectively assumed to be the same as polarizing directions of S-polarized light and P-polarized light contained in the source light. Here, the direction of the reflection axis and the direction of the transmission axis of the reflection-type polarizing plate 20 may be respectively assumed to be the same as the polarizing directions of the P-polarized light and the S-polarized light.

Ideally, in this case, when the source light emitted from the light-guiding plate 45 is applied to the reflection-type polarizing plate 20, out of the source light, P-polarized light is transmitted outside (not shown) through the reflection-type polarizing plate 20, and S-polarized light is reflected by the reflection-type polarizing plate 20 and applied to the liquid crystal panel 30 as light from a backlight. Further, out of the ambient light entering the reflection-type polarizing plate 20 from the back side, S-polarized light is reflected (not shown) by the reflection-type polarizing plate 20, and P-polarized light is transmitted through the reflection-type polarizing plate 20 and applied to the liquid crystal panel 30. The liquid crystal panel 30 selects one of the S-polarized light of the source light and the P-polarized light of the ambient light, or selects both of these by a predetermined proportion. By transmission of the selected polarization components further through the absorption-type polarizing plate 10, the transmitted polarization components allow a viewer to visually recognize an image and visually recognize background.

Actually, however, while a major part of the P-polarized light contained in the source light is transmitted outside through the reflection-type polarizing plate 20, a part of the P-polarized light is reflected by the reflection-type polarizing plate 20 similarly to the S-polarized light, and applied to the liquid crystal panel 30 as light from the backlight. At this time, the S-polarized light and the P-polarized light contained in the source light respectively account for 99% and 1%, for example. When such source light is applied to the liquid crystal panel 30, in a region in which an image is to be displayed, only the S-polarized light of the source light is selected and the image is displayed. However, in a region in which only the P-polarized light in the ambient light is to be transmitted to display background, the P-polarized light in the source light is transmitted by 1%, along with the P-polarized light in the ambient light transmitted through the reflection-type polarizing plate 20.

Further, the S-polarized light in the source light reflected by the reflection-type polarizing plate 20 is transmitted through the light-guiding plate 45, and applied to the liquid crystal panel 30. At this time, a part of the S-polarized light entering the light-guiding plate 45 may be converted into P-polarized light in some cases by Fresnel reflection on a surface of the light-guiding plate 45, or by scattering within the light-guiding plate 45. With this, through the region in which only the P-polarized light in the ambient light is to be transmitted to display background, the P-polarized light converted from the S-polarized light in the source light is transmitted, along with the P-polarized light in the ambient light.

As described above, in either case, through the region in which originally only the P-polarized light in the ambient light is to be transmitted to display background, not only the P-polarized light in the ambient light, but also the P-polarized light based on the source light, which is not in an ideal polarization state, is transmitted. As a result, as the P-polarized light based on the source light is transmitted in the region to be made transparent to display background and light is emitted, the screen becomes cloudy, and transparency decreases.

While completely eliminating the P-polarized light based on the source light which is not in the ideal polarization state would increase a sense of transparency when background is visually recognized through the liquid crystal panel 30, it is difficult, in practice, to eliminate this type of P-polarized light. Thus, according to the present invention, a sense of transparency is increased by proactively utilizing the P-polarized light based on the source light.

<1.2 Configuration of Image Display Device>

Figure 2:
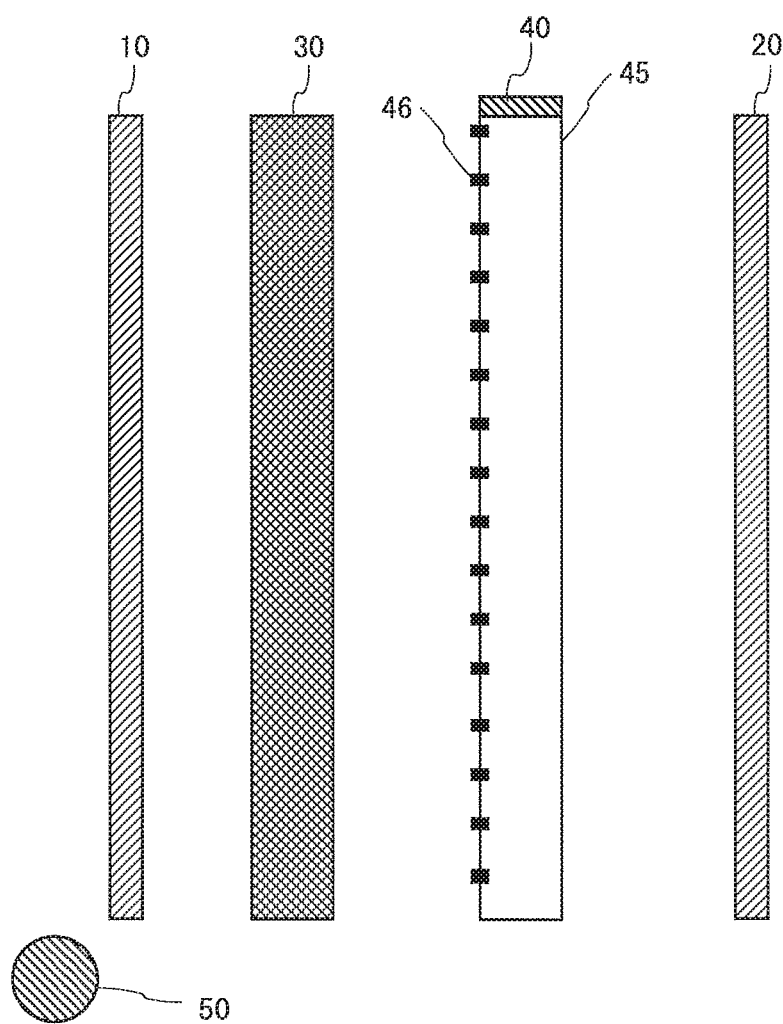
FIG. 2 is a diagram illustrating a configuration of a see-through-type display included in an image display device according to a first embodiment of the present invention.

FIG. 2 is a diagram illustrating a configuration of a see-through-type the display 110 included in an image display device 100 according to a first embodiment of the present invention. As illustrated in FIG. 2, the configuration of this display is the same as the configuration illustrated in FIG. 1. Therefore, like components of the components of the display in FIG. 1 are denoted by like reference numerals. In the following, each of the components will be described in detail.

The light-guiding plate 45 is configured as a plate-like body made of a transparent resin such as acrylic and polycarbonate, a plate-like body made of a transparent solid substance such as glass, a plate-like container in which a transparent gas such as air is enclosed, or the like. On an upper end of the light-guiding plate 45, there is provided the light source 40 of an edge-lit-type in which a plurality of LEDs (Light Emitting Devices) are arranged linearly. On a lower end of the light-guiding plate 45, there is provided a reflecting member (not shown) that reflects light emitted from the light source 40. Therefore, when source light containing P-polarized light and S-polarized light emitted from the light source 40 enters the light-guiding plate 45, the source light is directed downward or upward within the light-guiding plate 45 while being totally reflected by a front surface and a back surface of the light-guiding plate 45. Here, the edge-lit-type light source 40 is used in order to allow transmission of more ambient light. Further, an organic EL panel may be used as a light source. It should be noted that the light source 40 and the light-guiding plate 45 are collectively referred to as a "light source" in some cases.

On a surface of the light-guiding plate 45 on a side of the liquid crystal panel 30, scattering bodies 46 that reflect incident light are provided. Upon entrance of the source light into the scattering bodies 46, the source light is reflected by the scattering bodies 46, and applied to the reflection-type polarizing plate 20 mainly through a surface of the light-guiding plate 45 on a back side. As described above, the light-guiding plate 45 used in this embodiment is an asymmetric light-guiding plate that emits source light through its one surface.

Figure 3:
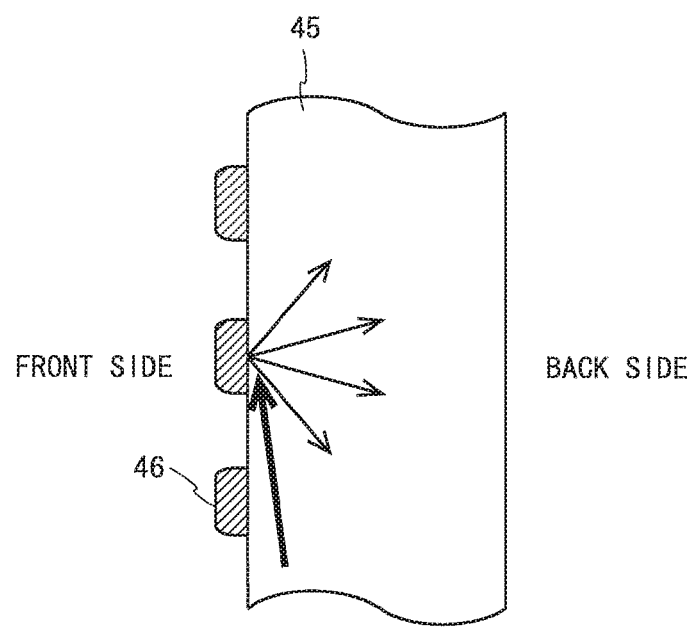
FIG. 3 is a diagram illustrating one example of scattering bodies formed on a surface of a light-guiding plate included in the display illustrated in FIG. 2.

The scattering bodies 46 formed on one surface of the light-guiding plate 45 in order to make the light-guiding plate 45 an asymmetric light-guiding plate will be described. FIG. 3 is a diagram illustrating one example of the scattering bodies 46 formed on the surface of the light-guiding plate 45. As illustrated in FIG. 3, on the surface of the light-guiding plate 45 on the side of the liquid crystal panel 30, as the scattering bodies 46, dots of a size of about a few μm printed in opaque ink are formed by ink-jet printing. When the source light directed downward or upward within the light-guiding plate 45 while being totally reflected enters any of the dots, the source light is scattered by the scattering bodies, and emitted to the reflection-type polarizing plate 20 through a surface opposite to the surface on which the dots are formed. Further, a diffusing agent such as silica may be added to the light-guiding plate 45, or concavity and convexity may be formed on at least one of the front surface and the back surface of the light-guiding plate 45. A reason why such a diffusing agent is added or concavity and convexity are formed on the surface will be described later.

The liquid crystal panel 30 may be a panel with which, in an off state (a state in which no image signal is written), the viewer on a front side of the display is able to visually recognize ambient light that enters from the back side and is transmitted through the reflection-type polarizing plate 20, the liquid crystal panel 30, and the absorption-type polarizing plate 10 in order. In an on state (a state in which an image signal is written), the liquid crystal panel 30 increases its transmittance according to an image signal and therefore allow transmission of more light from the backlight, and displays an image according to the image signal. The liquid crystal panel 30 thus configured may be achieved by adjusting directions of transmission axes of absorption-type polarizing plates respectively attached to both surfaces of the panel. For example, in a normally-black-type liquid crystal panel of a TN (Twisted Nematic) type, a direction of a transmission axis of the absorption-type polarizing plate attached to a front surface is orthogonal to a direction of a transmission axis of the absorption-type polarizing plate attached to aback surface. With this, the liquid crystal panel 30 becomes transparent by transmitting the ambient light entered from the back side in the off state, and increases its transmittance in the on state according to a signal voltage and displays an image. It should be noted that, out of the absorption-type polarizing plates attached to the both surfaces of the liquid crystal panel 30, the absorption-type polarizing plate attached to the front surface of the liquid crystal panel 30 corresponds to the absorption-type polarizing plate 10 described above, and the absorption-type polarizing plate attached to the back surface is not shown in the drawings. Here, the absorption-type polarizing plate 10, the reflection-type polarizing plate 20, and the liquid crystal panel 30 are collectively referred to as an "image display unit" in some cases.

The display is provided with a color illuminance sensor for measuring illuminance, chromaticity, and a color temperature of the ambient light. The color illuminance sensor 50 is attached to a picture-frame or the like of the display, and directed toward the viewer. The color illuminance sensor 50 is able to measure the illuminance, the chromaticity, and the color temperature of the ambient light in order. It should be noted that a position of the color illuminance sensor 50 to be attached is not limited to the picture-frame of the display, and may be a side surface, a back surface, or an upper surface of the display, or a position distant form the display. Here, the color illuminance sensor is referred to as an "ambient light measuring sensor" in some cases.

Figure 4:
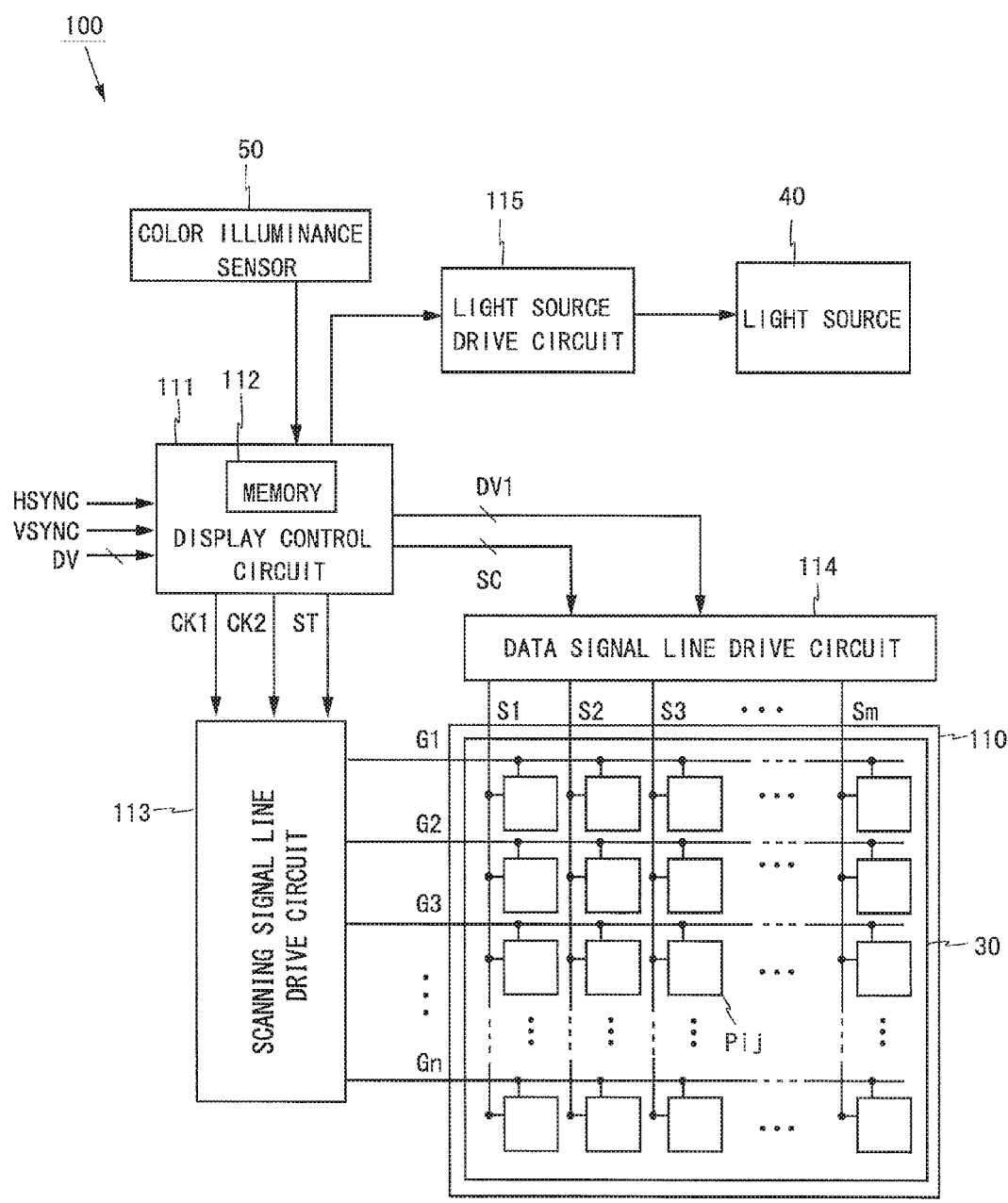
FIG. 4 is a block diagram illustrating a configuration of the image display device including the display illustrated in FIG. 2.

FIG. 4 is a block diagram illustrating a configuration of the image display device 100 including the display illustrated in FIG. 2. As illustrated in FIG. 4, the image display device 100 is an active matrix-type display device including a display 110, a display control circuit 111, a scanning signal line drive circuit 113, a data signal line drive circuit 114, a light source drive circuit 115, and the light source 40. While the display 110 includes various types of polarizing plates other than the liquid crystal panel 30, illustration of those polarizing plates is omitted.

The liquid crystal panel 30 includes n scanning signal lines G1 to Gn, m data signal lines S1 to Sm, and (m×n) pixels Pij (where m is an integer of not smaller than 2, and j is an integer of not smaller than 1 and not greater than m). The scanning signal lines G1 to Gn are disposed in parallel with each other, and the data signal lines S1 to Sm are disposed in parallel with each other and perpendicular to the scanning signal lines G1 to Gn. The pixel Pij is disposed near an intersection between the scanning signal line G1 and the data signal line Sj. In this manner, the (m×n) pixels Pij are arranged two-dimensionally such that m pixels are disposed in a line direction and n pixels in a column direction. The scanning signal line G1 is commonly connected to the pixels Pij disposed along an i-th line, the data signal line Sj is commonly connected to the pixel Pij disposed along a j-th column.

From outside of the image display device 100, control signals such as a horizontal synchronizing signal HSYNC and a vertical synchronizing signal VSYNC, and an the image signal DV are supplied. Based on these signals, the display control circuit 111 outputs a clock signal CK and a start pulse ST to the scanning signal line drive circuit 113, and a control signal SC and an image signal DV1 to the data signal line drive circuit 114.

The display control circuit 111 includes a memory 112 that stores the illuminance, the chromaticity, and the color temperature measured by the color illuminance sensor 50 or obtained by calculation. Further, the display control circuit 111 controls the light source drive circuit 115 so that the light source 40 emits source light of desired luminance.

The scanning signal line drive circuit 113 supplies a high-level output signal to each of the scanning signal lines G1 to Gn sequentially. With this, the scanning signal lines G1 to Gn are selected sequentially one by one, and the pixels Pij for a single line are selected at once. The data signal line drive circuit 114 supplies a signal voltage according to the image signal DV1 to the data signal lines S1 to Sm based on the control signal SC and the image signal DV1. With this, the signal voltage according to the image signal DV1 is written to the pixels Pij selected for a single line. The image display device 100 displays an image on the liquid crystal panel 30 in this manner. It should be noted that the display control circuit 111, the scanning signal line drive circuit 113, the data signal line drive circuit 114, and the light source drive circuit 115 are collectively referred to as a "drive control unit" in some cases.

The image display device 100 displays a color image based on field sequential driving in which light in red, green, and blue is subjected to time-division and sequentially applied. Alternatively, a color image may be displayed by forming a color filter on the surface of the liquid crystal panel 30. Here, as these techniques for displaying a color image are well known, detailed descriptions for these techniques are omitted.

<1.3 Operation of Image Display Device>

Figure 5:
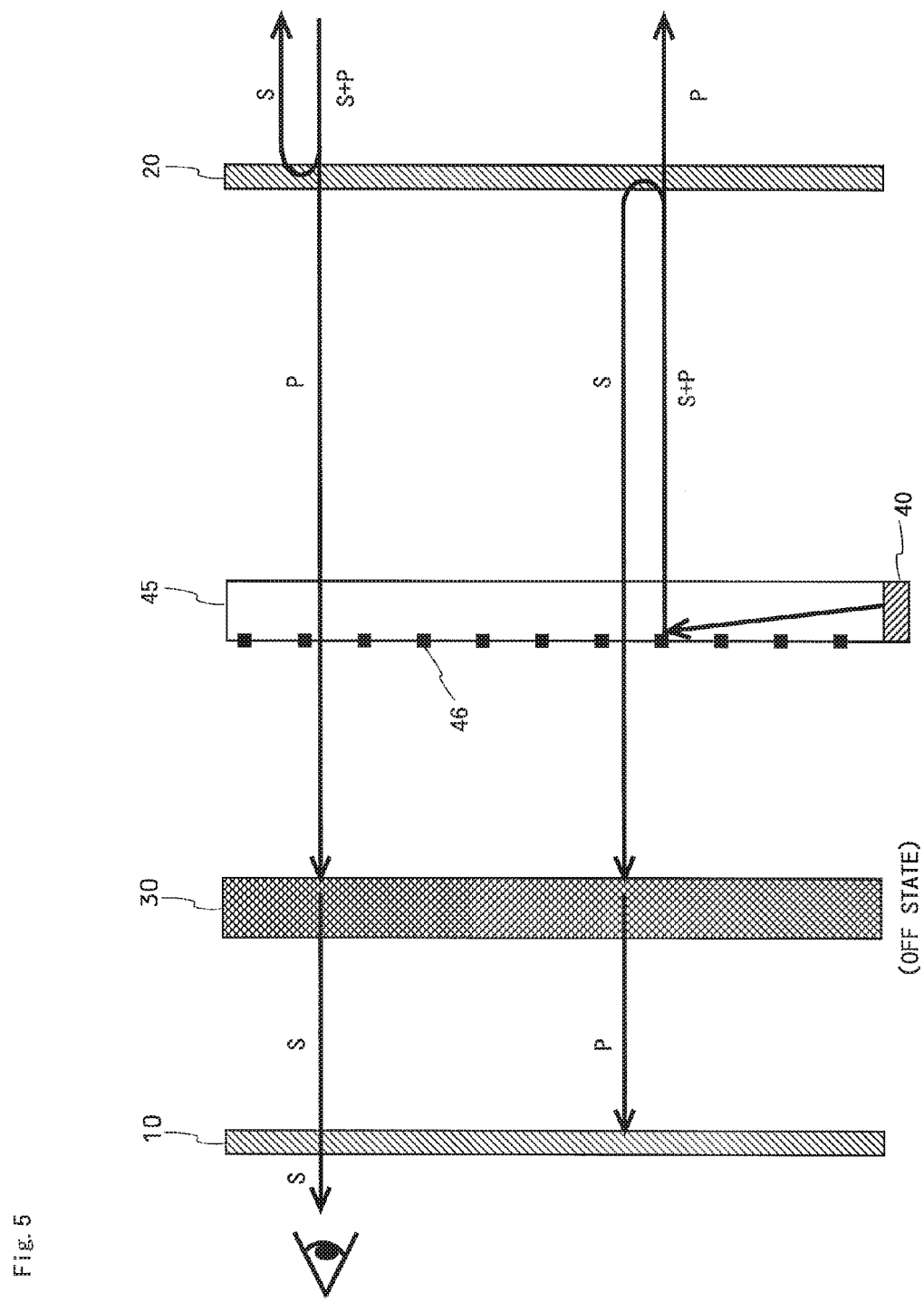
FIG. 5 is a diagram illustrating the transmission paths of the source light and the ambient light when a liquid crystal panel of the display illustrated in FIG. 2 is in an off state.
Figure 6:
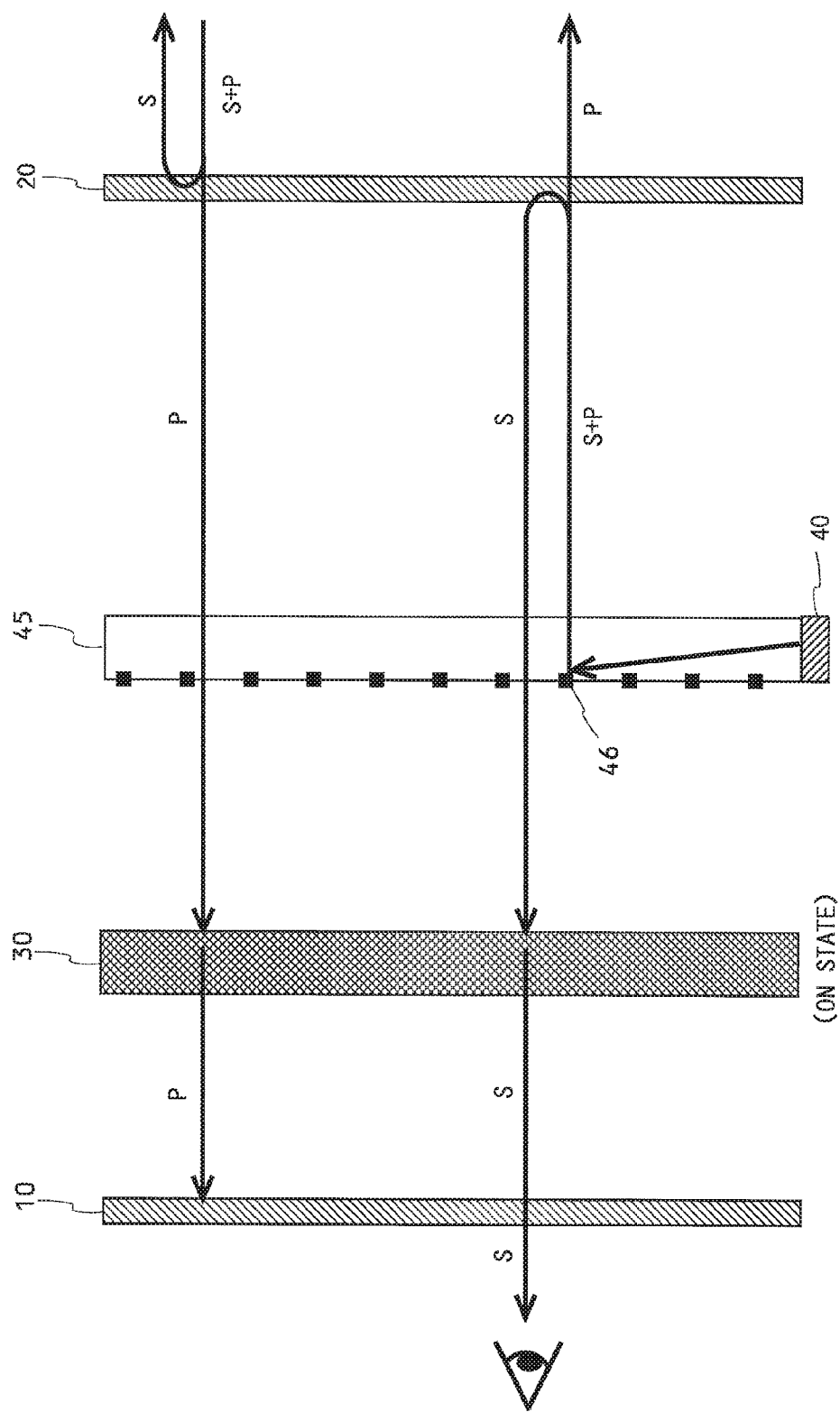
FIG. 6 is a diagram illustrating the transmission paths of the source light and the ambient light when the liquid crystal panel of the display illustrated in FIG. 2 is in an on state.

FIG. 5 and FIG. 6 illustrate the transmission paths of the source light and the ambient light when an image or background is displayed in the image display device 100. More specifically, FIG. 5 is a diagram illustrating the transmission paths of the source light and the ambient light when the liquid crystal panel 30 is in the off state, and FIG. 6 is a diagram illustrating the transmission paths of the source light and the ambient light when the liquid crystal panel 30 is in the on state. Here, in FIG. 5 and FIG. 6, it is assumed that the reflection-type polarizing plate 20 transmits P-polarized light and reflects S-polarized light, and the absorption-type polarizing plate 10 absorbs P-polarized light and transmits S-polarized light.

First, a description is given with reference to FIG. 5. When the source light emitted from the light source 40 is applied to the reflection-type polarizing plate 20 by the light-guiding plate 45, the P-polarized light is transmitted outside through the reflection-type polarizing plate 20, and the S-polarized light is reflected by the reflection-type polarizing plate 20 and applied to the liquid crystal panel 30. As the liquid crystal panel 30 is in the off state, a polarizing direction of the incident S-polarized light is rotated by 90 degrees and emitted as P-polarized light. The P-polarized light is absorbed to the absorption-type polarizing plate 10, and may not be transmitted to the front side. On the other hand, P-polarized light in the ambient light is transmitted through the reflection-type polarizing plate 20, and applied to the liquid crystal panel 30. As the liquid crystal panel 30 is in the off state, a polarizing direction of the incident P-polarized light is rotated by 90 degrees and emitted as S-polarized light. The S-polarized light is transmitted through the absorption-type polarizing plate 10. As described above, when the liquid crystal panel 30 is in the off state, the viewer is able to visually recognize background by the transmitted S-polarized light in the ambient light.

Next, a description is given with reference to FIG. 6. When the source light emitted from the light source 40 is applied to the reflection-type polarizing plate 20 by the light-guiding plate 45, the P-polarized light is transmitted outside through the reflection-type polarizing plate 20, and the S-polarized light is reflected by the reflection-type polarizing plate 20 and applied to the liquid crystal panel 30. As the liquid crystal panel 30 is in the on state, the polarizing direction of the incident S-polarized light does not change and emitted as the S-polarized light. The S-polarized light is transmitted through the absorption-type polarizing plate 10. On the other hand, P-polarized light in the ambient light is transmitted through the reflection-type polarizing plate 20, and applied to the liquid crystal panel 30. As the liquid crystal panel 30 is in the on state, the polarizing direction of the incident P-polarized light is not rotated and emitted as P-polarized light. The P-polarized light is absorbed to the absorption-type polarizing plate 10, and may not be transmitted to the front side. As described above, when the liquid crystal panel 30 is in the on state, the viewer is able to visually recognize background by the transmitted S-polarized light of the source light.

<1.4 Adjustment of Image Display Device>

Figure 7:
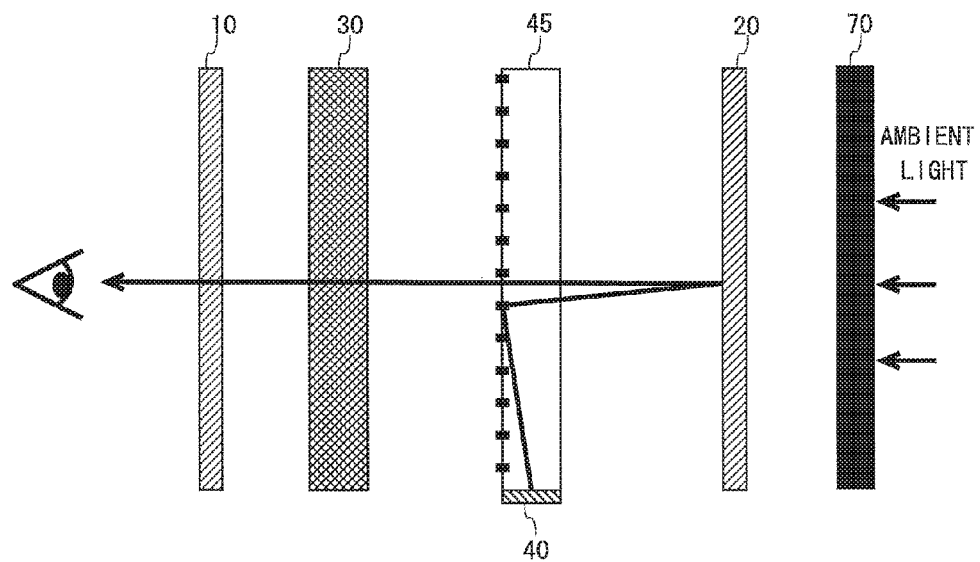
FIG. 7 is a diagram illustrating a first state representing the source light transmitted through the display illustrated in FIG. 2.
Figure 8:
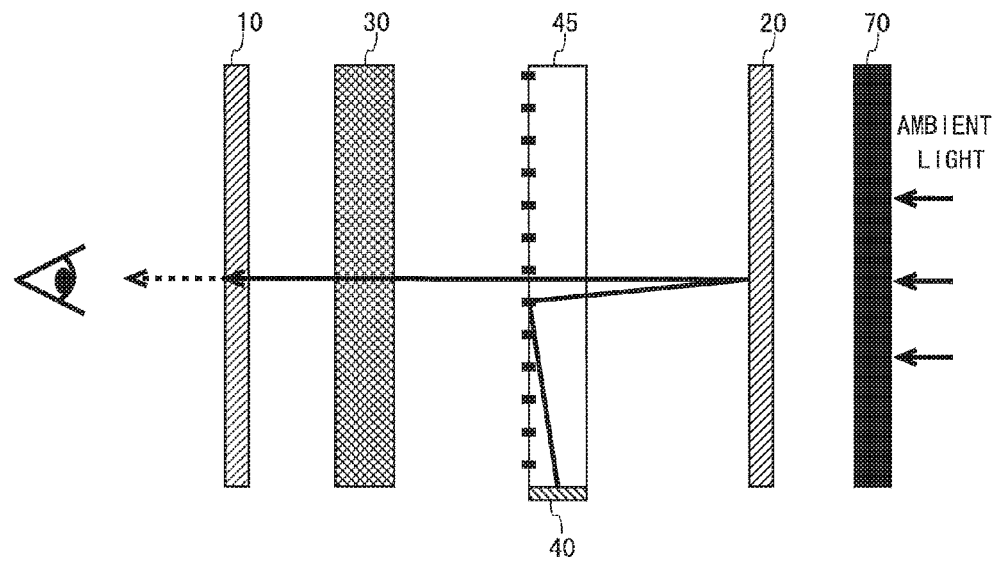
FIG. 8 is a diagram illustrating a second state representing the source light transmitted through the display illustrated in FIG. 2.
Figure 9:
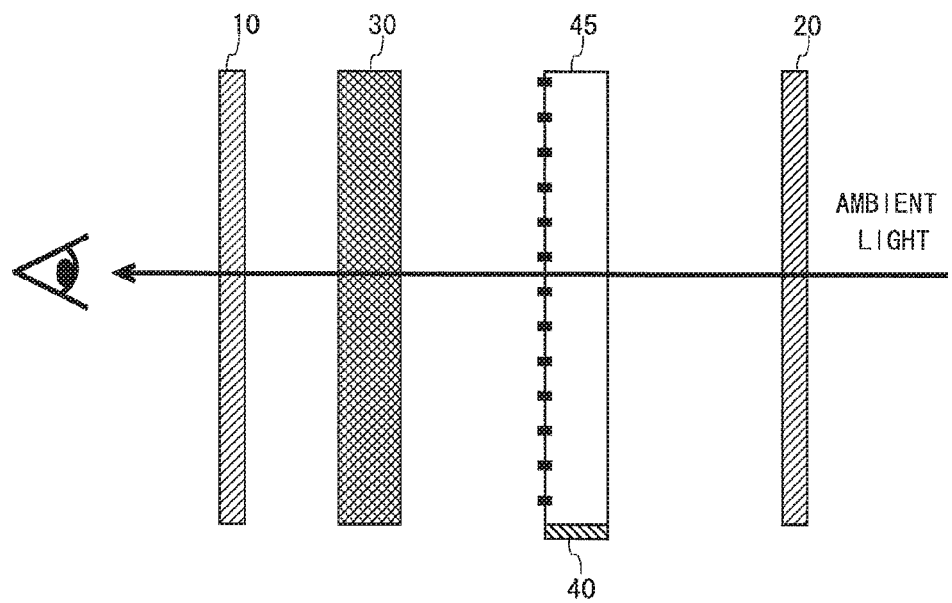
FIG. 9 is a diagram illustrating a third state representing the ambient light transmitted through the display illustrated in FIG. 2.
Figure 10:
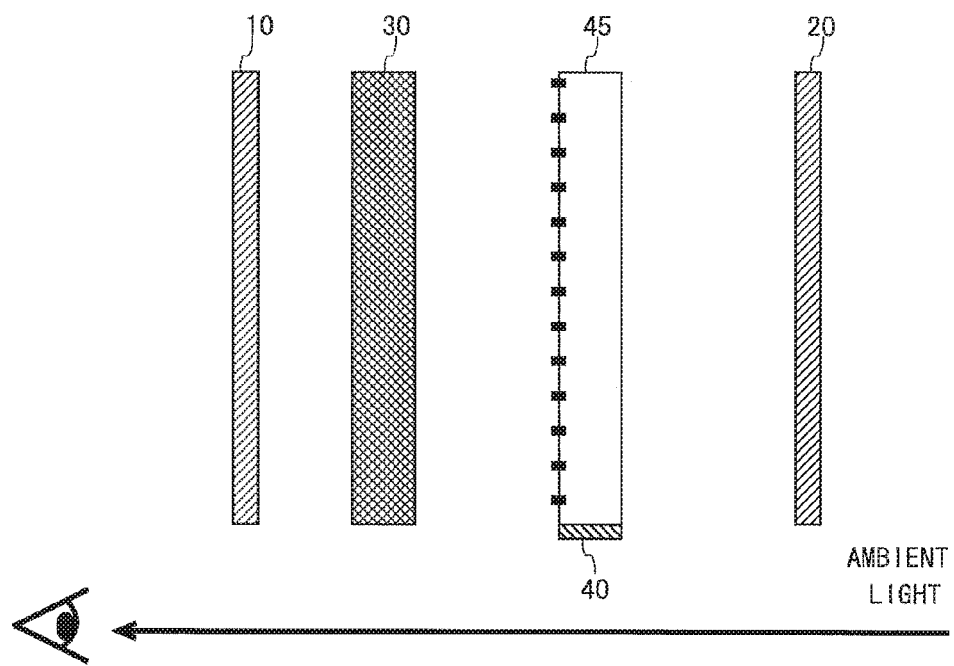
FIG. 10 is a diagram illustrating a fourth state representing the ambient light that is not transmitted through the display illustrated in FIG. 2.

FIG. 7 is a diagram illustrating a first state A representing the source light transmitted through the screen of the image display device 100, FIG. 8 is a diagram illustrating a second state B representing the source light transmitted through the screen of the image display device 100, FIG. 9 is a diagram illustrating a third state C representing the ambient light transmitted through the screen of the image display device 100, and FIG. 10 is a diagram illustrating a fourth state D representing the ambient light that is not transmitted through the screen of the image display device 100. As described above, the light transmitted through the screen of the image display device 100 falls in one of the four states. Hereinafter, these four states will be described.

As illustrated in FIG. 7, the first state A is a state representing brightness of the source light which is taken out when a back surface of the image display device 100 is covered by a black cloth 70 so that only a displayed content is seen. In this state, the viewer is able to visually recognize a displayed image having gradation.

As illustrated in FIG. 8, the second state B is a state representing brightness of the source light that has escaped to a region where the ambient light is originally to be taken out, when similarly to the first state, the back surface of the image display device 100 is covered by the black cloth 70 so that only a displayed content is seen.

As illustrated in FIG. 9, the third state C is a state representing brightness of the ambient light that is transmitted through the liquid crystal panel 30 when the liquid crystal panel 30 and the light source 40 are turned off without covering the back surface of the image display device 100 by a black cloth or the like so that only background is seen. In this state, the viewer is able to visually recognize the background through the liquid crystal panel 30.

As illustrated in FIG. 10, the fourth state D is a state representing brightness of the ambient light that has reached the front side of the display without being transmitted through the display. In this state, the viewer is able to visually recognize the background directly without through the display.

In the see-through-type display, in order to improve visibility of an image in a state in which transparency is maintained high, it is required to adjust illuminance, chromaticity, and a color temperature in the first state to the fourth state. Therefore, a method of adjusting illuminance, chromaticity, and a color temperature will be described.

<1.5 Method of Obtaining Illuminance, Chromaticity, and Color Temperature>

Figure 11:
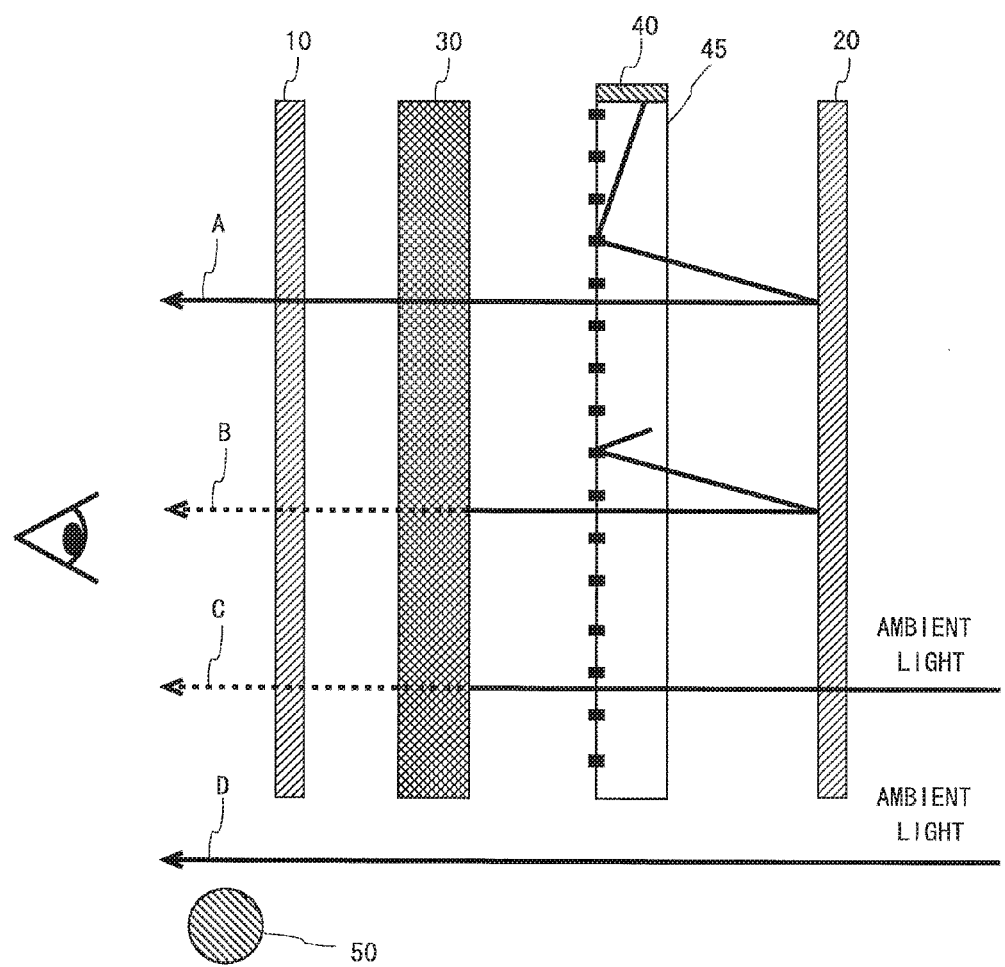
FIG. 11 is a diagram illustrating the transmission paths of the source light and the ambient light in the display illustrated in FIG. 2, in the four states shown in FIG. 7 through FIG. 10.

FIG. 11 is a diagram illustrating the transmission paths of the source light and the ambient light in the corresponding states. The luminance, the chromaticity, and the color temperature of the source light and the ambient light are obtained in the following manner. In the first state A, the luminance, the chromaticity, and the color temperature of the source light are obtained by calculation based on types and characteristics of the liquid crystal panel 30, the absorption-type polarizing plate 10, and the reflection-type polarizing plate 20 used for the image display device 100, a method of light emission employed by the light source 40, characteristics of the light-guiding plate 45, electricity supplied to the image display device 100, and the like. At this time, representative values (e.g., average values) of luminance, chromaticity, and a color temperature when a white display is displayed over an entire region of the liquid crystal panel 30 where an image is to be displayed are respectively taken as the luminance, the chromaticity, and the color temperature in the first state A.

In the second state B, the configuration of the image display device 100 determines a proportion of escaped source light in the source light in the first state A. With this, luminance of the escaped source light in the second state B is determined. Further, as chromaticity and a color temperature of the escaped source light are substantially the same as the chromaticity and the color temperature of the source light in the first state A, the chromaticity and the color temperature of the source light in the first state A are taken as the chromaticity and the color temperature in the second state B.

In the fourth state D, illuminance, chromaticity, and a color temperature measured by the color illuminance sensor 50 are respectively taken as luminance, chromaticity, and a color temperature in the fourth state D.

In the third state C, luminance is obtained by multiplication of the illuminance measured by the color illuminance sensor 50 in the fourth state D and transmittance of the liquid crystal panel 30. Further, chromaticity and a color temperature are obtained by multiplication of the chromaticity and the color temperature measured by the color illuminance sensor 50 in the fourth state D and a coefficient representing a color of the liquid crystal panel 30. It should be noted that the above described each calculation in the first state A to the third state C is performed by the display control circuit 111.

In the four states described above, the viewer is able to visually recognize three states of the first state A, a state combining the second state B and the third state C, and the fourth state D. The viewer is not able to visually recognize distinguishing the second state B from the third state C. Luminance, chromaticity, and a color temperature in the state combining the second state B and the third state C are obtained by adding the luminance, the chromaticity, and the color temperature in the third state C respectively to the luminance, the chromaticity, and the color temperature in the second state B.

<1.6 Adjustment of Brightness in Each State>

Brightness of the screen of the display in each of the states is adjusted by adjusting luminance of the source light by driving the light source 40 so that its brightness satisfies an expression (1).

Brightness in Fourth State>Brightness in First State>Brightness in(Second State+Third State)    (1)

As described above, the brightness in the fourth state is represented by the luminance of the ambient light measured by the color illuminance sensor 50. On the other hand, the brightness in the first state is obtained by calculation using a constant considering an influence of the components of the display. Therefore, in order to approximate the luminance of the source light to the luminance of the ambient light within a range in which the expression (1) is satisfied, the light source 40 is driven by varying the constant. As this allows the light source 40 to emit the source light of desired luminance, it is possible to change the brightness in the first state. For example, when the measured value of the illuminance of the ambient light in the fourth state is high, adjustment is performed so that the luminance of the source light in the first state becomes high within the range in which the expression (1) is satisfied. Further, when the measured value of the illuminance of the ambient light in the fourth state is low, adjustment is performed so that the luminance of the source light in the first state becomes low within the range in which the expression (1) is satisfied.

Moreover, if the luminance of the source light and the ambient light is determined, the brightness in the second state and the third state is also determined. The brightness in the third state is determined according to the luminance of the ambient light, and may not be changed. However, the brightness in the second state is determined according to the luminance of the source light, and may be changed by adjusting the source light. For example, as the expression (1) is not satisfied when the brightness in the state combining the second state and the third state is higher than the brightness in the first state, the source light is adjusted so as to decrease its luminance.

In this manner, the light from the backlight is adjusted so that the brightness in the first state is highest within the range in which the expression (1) is satisfied. With this, the viewer is able to visually recognize an image displayed in easily viewable brightness.

<1.7 Adjustment of Chromaticity and Color Temperature in Each State>

When differences of the chromaticity and the color temperature in the state combining the second state and the third state respectively from the chromaticity and the color temperature in the fourth state become larger, the viewer has more difficulty in obtaining a sense of high transparency. Here, the chromaticity and the color temperature in the third state are determined based on the color of the liquid crystal panel 30, and may not be changed. Therefore, a process for correcting the driving of the liquid crystal panel 30 to have the chromaticity and the color temperature in the second state be changed and approximated to the chromaticity and the color temperature in the fourth state will be described. It should be noted that the process described below is performed by the display control circuit 111.

Figure 12:
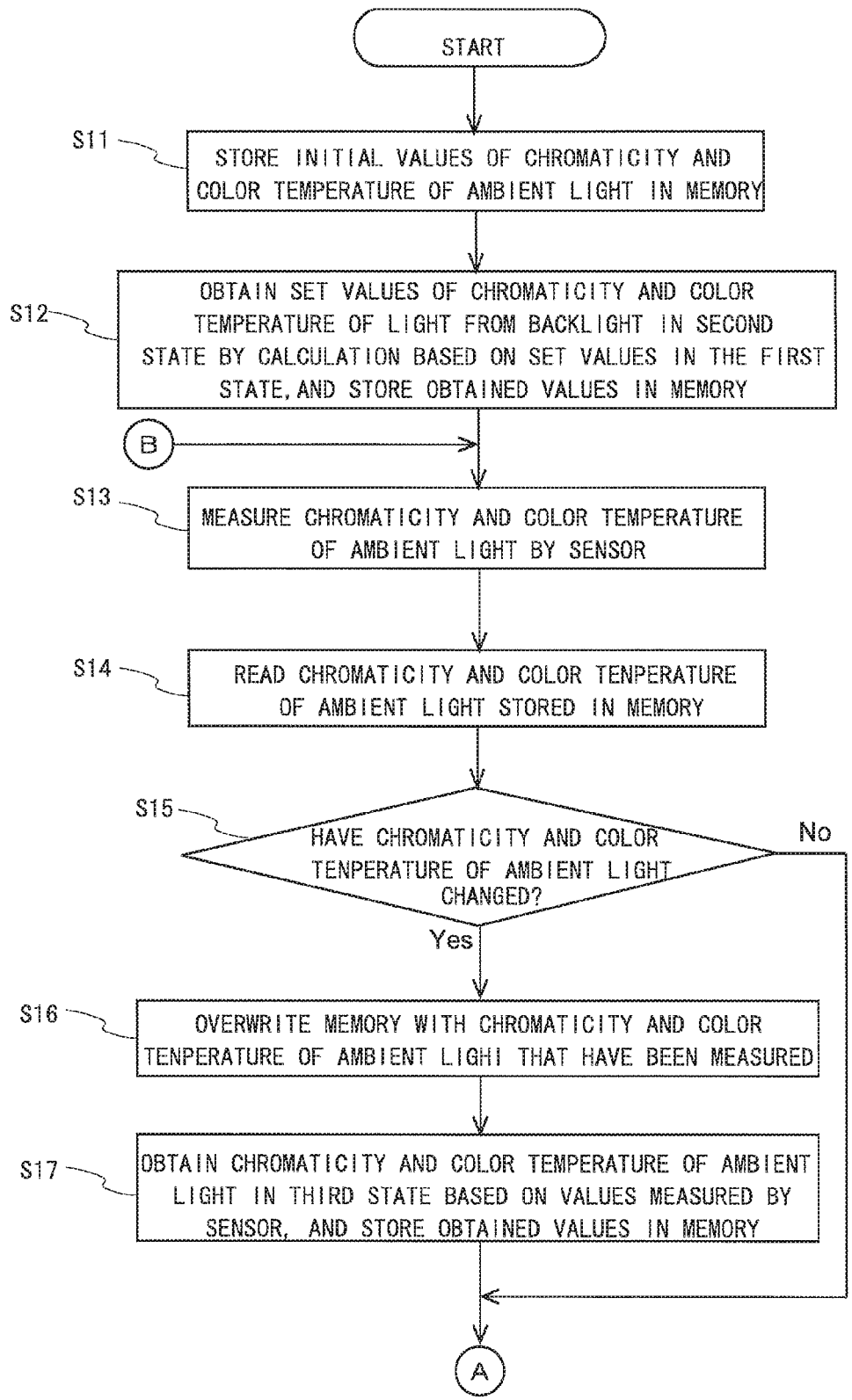
FIG. 12 is a flowchart showing a first half of processing steps for correcting chromaticity and a color temperature of the source light in the image display device illustrated in FIG. 4.
Figure 13:
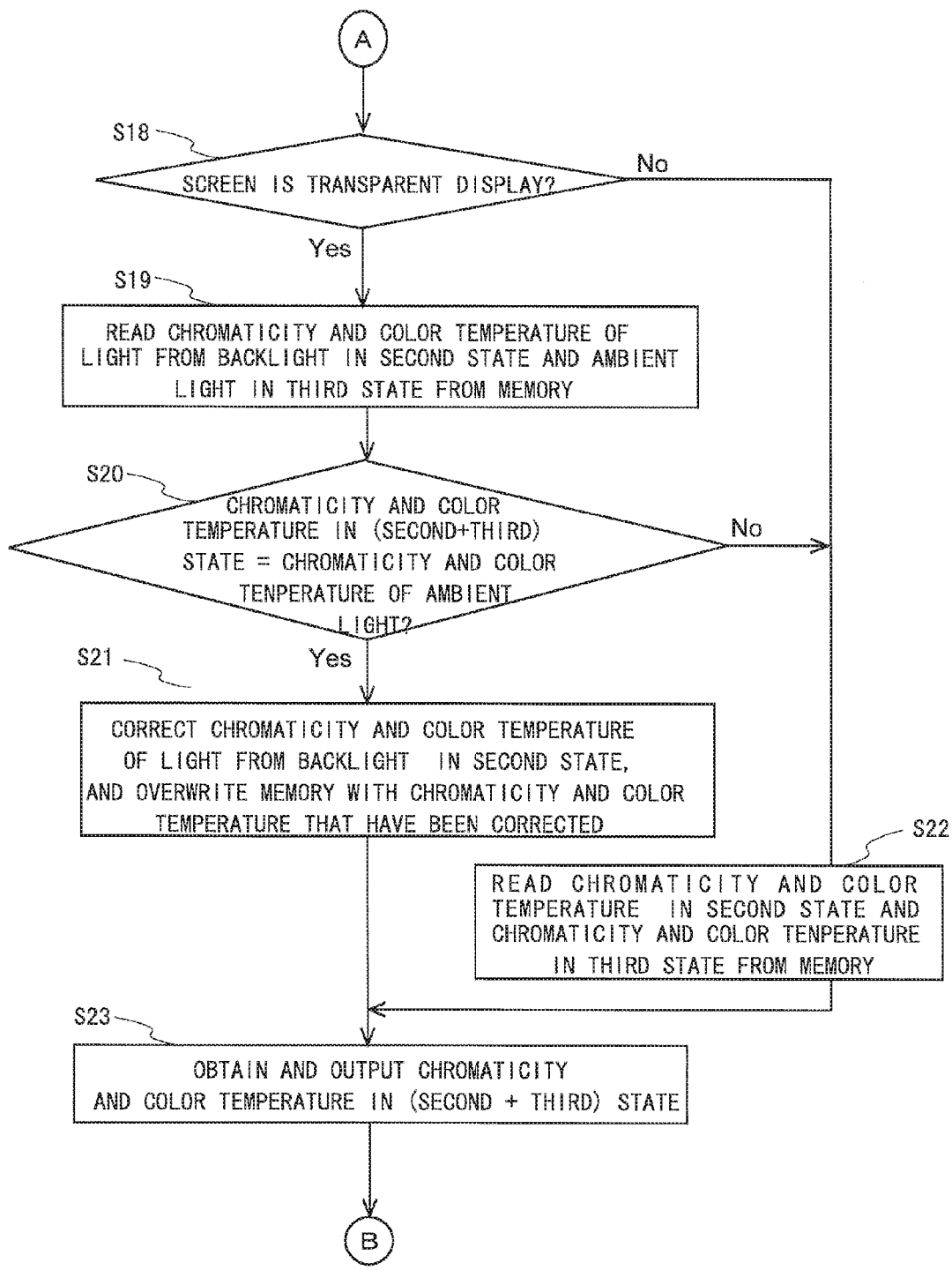
FIG. 13 is a flowchart showing a second half of the processing steps for correcting the chromaticity and the color temperature of the source light in the image display device illustrated in FIG. 4.

FIG. 12 and FIG. 13 are flowcharts showing processing steps for correcting the chromaticity and the color temperature of the source light. As shown in FIG. 12 and FIG. 13, in step S11, initial values of the chromaticity and the color temperature of the ambient light are stored in the memory 112. In step S12, first, the chromaticity and the color temperature of the source light in the first state are obtained using a constant determined by the components such as the liquid crystal panel 30. At this time, the representative values (e.g., average values) of the luminance, the chromaticity, and the color temperature when a white display is displayed over an entire region of the liquid crystal panel 30 where an image is to be displayed are respectively taken as the luminance, the chromaticity, and the color temperature in the first state A. Next, the chromaticity and the color temperature of the source light in the second state are obtained from the chromaticity and the color temperature of the source light in the first state based on a relation between the first state and the second state, and the chromaticity and the color temperature that have been obtained are stored in the memory 112 of the display control circuit 111.

In step S13, the chromaticity and the color temperature of the ambient light, that is, the chromaticity and the illuminance of the ambient light in the fourth state are measured by the color illuminance sensor 50 attached to the image display device 100. In step S14, the chromaticity and the color temperature of the ambient light are read from the memory 112.

In step S15, the chromaticity and the color temperature of the ambient light measured in step S13 are compared with the chromaticity and the color temperature of the ambient light read from the memory 112 in step S14, and it is determined whether or not the ambient light has changed. As a result, if it is determined that the chromaticity and the color temperature of the ambient light are not changed, the process moves to step S22 described later, and if it is determined that either the chromaticity or the color temperature of the ambient light is changed, the process moves to step S16.

In step S16, the memory 112 is overwritten with the chromaticity and the color temperature of the ambient light that have been measured. In step S17, the chromaticity and the color temperature of the ambient light that have been measured are adjusted considering the color of the liquid crystal panel 30, and the chromaticity and the color temperature of the ambient light in the third state are obtained and stored in the memory 112.

In step S18, it is determined whether or not the screen is a transparent display for displaying background. As a result, if it is determined that the screen is not a transparent display, the process moves to step S22 described later, and if it is determined that the screen is a transparent display, the process moves to step S19. In step S19, the chromaticity and the color temperature of the source light in the second state and the chromaticity and the color temperature of the ambient light in the third state are read from the memory 112.

In step S20, it is determined whether or not the chromaticity and the color temperature in the state combining the second state and the third state that have been read are equal to the chromaticity and the color temperature of the ambient light. As a result, if it is determined that the chromaticity and the color temperature are not equal, the process moves to step S22 described later, and if it is determined that the chromaticity and the color temperature are equal, the process moves to step S21.

In step S21, the chromaticity and the color temperature of the source light in the first state are adjusted to correct the chromaticity and the color temperature of the source light in the second state B that have been read from the memory 112, and the memory 112 is overwritten with the chromaticity and the color temperature that have been corrected. The correction is performed by adjusting the driving of the liquid crystal panel 30 according to a constant obtained considering an influence of the components such as the liquid crystal panel 30.

Further, when it is determined that the screen is not a transparent display in step S18, or when it is determined that the chromaticity and the color temperature in the state combining the second state and the third state that have been read are not equal to the chromaticity and the color temperature of the ambient light in step S20, the chromaticity and the color temperature in the second state corrected in step S21, or the chromaticity and the color temperature in the state combining the chromaticity and the color temperature in the second state and the chromaticity and the color temperature in the third state that have been read from the memory 112 in step S19 are obtained and output to the data signal line drive circuit 114. Then, the process returns to step S13.

As described above, by utilizing the polarization component based on the source light in the second state, which is not in the ideal polarization state, it is possible to reduce differences of chromaticity and a color temperature of background when seen through the liquid crystal panel 30 from chromaticity and a color temperature of an actual background object. With this, the viewer feels that transparency is increased. As described above, a diffusing agent is added to the light-guiding plate 45 or concavity and convexity are formed on the surface in order to increase polarization components not in the ideal polarization state. This allows to further approximate the chromaticity and the color temperature of the background when seen through the liquid crystal panel 30 to the chromaticity and the color temperature of the actual background object.

Further, adjustment of the luminance of the source light so as to satisfy the expression (1) and adjustment to reduce the differences of the chromaticity and the color temperature of the background when seen through the liquid crystal panel 30 from the chromaticity and the color temperature of the actual background object may be performed independently from each other. Therefore, only one of the adjustments may be performed.

<1.8 Brightness of Screen in Each State>

FIG. 14 shows charts showing brightness of the screen in the first state to the fourth state. More specifically, FIG. 14(*a*) shows the brightness of the screen in each of the states when the light source 40 is turned to the on state in a case where a measured value of illuminance of the ambient light is low, FIG. 14(*b*) shows the brightness of the screen in each of the states when the light source 40 is turned to the off state, and FIG. 14(*c*) shows the brightness of the screen in each of the states when the light source 40 is turned to the on state in a case where a measured value of illuminance of the ambient light is high.

As shown in FIG. 14(*a*), when the source light and the ambient light are transmitted through the screen, a screen in the fourth state is brighter than a screen in the first state A. Further, a screen in the state combining the second state B and the third state C is darker than the screen in the first state A. Therefore, it can be seen that all of the states shown in FIG. 14(*a*) satisfy the expression (1), and an image is displayed with easily viewable brightness.

As shown in FIG. 14(*b*), the light source 40 is turned off, and the brightness in the first state and the second state is "0". In this case, in the third state, the ambient light is weak under an influence of transmittance of the liquid crystal panel 30 as compared to the brightness in the fourth state, but the viewer is able to visually recognize background.

As shown in FIG. 14(*c*), as a measured value of the illuminance of the ambient light is large, it is possible to make the luminance of the source light in the first state higher than the case shown in FIG. 14(*a*), in order to satisfy a condition of the expression (1). With this, not only the background but also the image may be displayed brightly. It should be noted that while as the luminance of the ambient light and the source light increases, the luminance of the ambient light in the third state and the luminance of the source light in the second state also increase respectively at predetermined ratios, the brightness in the states satisfies the expression (1). Accordingly, it can be seen that the image is displayed with more easily viewable brightness.

<1.9 Effects>

According to this embodiment, the display control circuit 111 drives the liquid crystal panel 30 by controlling the scanning signal line drive circuit 113 and the data signal line drive circuit 114 by correcting the constant calculated considering the components of the liquid crystal panel 30 so that the chromaticity and the color temperature of the source light in the second state are approximated to the chromaticity and the color temperature of the ambient light in the fourth state measured by the color illuminance sensor 50. With this, in the region for showing background that is conventionally seen less transparent due to the color of the image display unit, transparency of the liquid crystal panel 30 seems to be increased and the viewer is able to see the background more easily.

Further, the display control circuit 111 drives the light source 40 by correcting the constant calculated considering the components of the liquid crystal panel 30 so that the luminance of the source light of the first state is approximated to the luminance of the ambient light of the fourth state within the range in which the expression (1) is satisfied. With this, it is possible to display an image with easily viewable brightness, and the viewer is able to visually recognize the image more easily.

2. Second Embodiment

Figure 15:
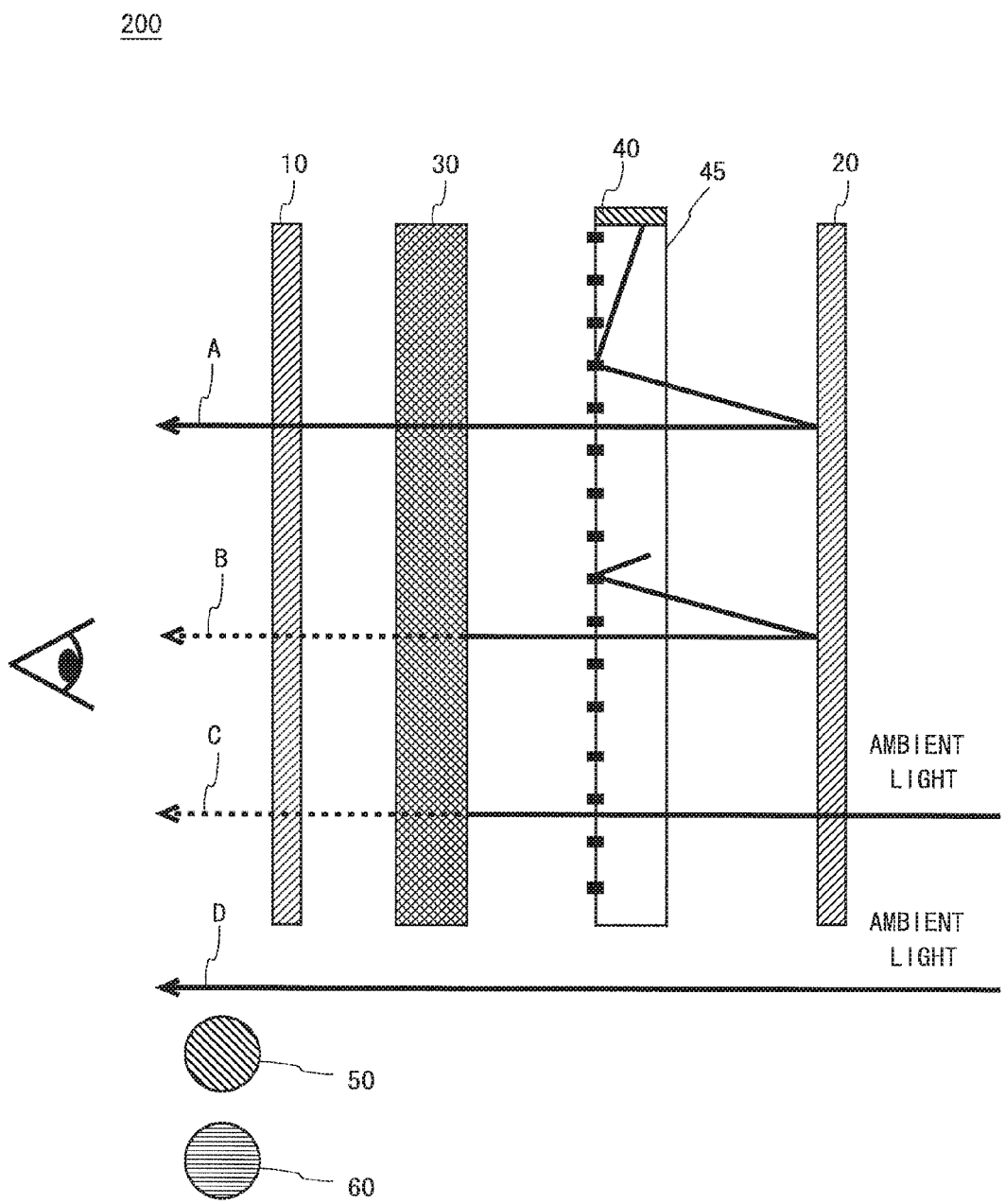
FIG. 15 is a diagram illustrating transmission paths of source light and ambient light in a display of an image display device according to a second embodiment of the present invention, in the first state to the fourth state shown in FIG. 7 through FIG. 10.

FIG. 15 is a diagram illustrating transmission paths of source light and ambient light in a display of an image display device 200 according to a second embodiment of the present invention, in the above described states. As illustrated in FIG. 15, the image display device 200 of this embodiment has the same configuration as the image display device 100 according to the first embodiment, other than that a motion detector 60 is attached. Therefore, like components are denoted by like reference numerals and descriptions of those components will be omitted. Further, as a first state A to a fourth state D are the same as those in the first embodiment, these states are denoted by like reference numerals and descriptions of the states will be omitted.

In the case of the image display device 100 according to the first embodiment, the light source 40 remains lit up even when there is no viewer. Therefore, a time period in which the light source 40 is lit up becomes long, and power consumption of the image display device 100 increases. Further, the light applied to the liquid crystal panel 30 when the light source 40 is not lit up is limited to the ambient light which enters from the back side, or the ambient light which enters from the front side and is reflected by the reflection-type polarizing plate 20. In this case, visibility decreases as display quality of the image depends on the luminance of the ambient light.

Therefore, the motion detector 60 that detects whether or not there is any viewer near the image display device 200 is provided, and the light source 40 is made to emit slight light only when the motion detector 60 detects the viewer near the image display device 200, and turn off when no viewer is detected. As used herein, the slight light emission refers to lighting up of the light source 40 so as to achieve minimum brightness required for driving to have the chromaticity and the color temperature in the state combining the second state and the third state be approximated respectively to the chromaticity and the color temperature of the ambient light in the fourth state.

By causing the motion detector 60 to detect the viewer and the light source 40 to perform slight light emission, the chromaticity and the color temperature in the state combining the second state and the third state may be approximated to the chromaticity and the color temperature of the ambient light by adjusting the source light in the same manner as described in the first embodiment. This gives the viewer a higher sense of transparency of the screen in which background is displayed.

Further, the luminance of the light source 40 is adjusted so that the brightness of the screen in the first state is approximated to the brightness of the screen in the fourth state within the range in which the expression (1) is satisfied. With this, the viewer is able to visually recognize an image displayed with easily viewable brightness.

The motion detector 60 is attached, next to the color illuminance sensor 50, to the picture-frame under the display. However, as the motion detector 60 only needs to detect the viewer who comes to a position at which an image or background in the display can be visually recognized by the viewer, the motion detector 60 may be attached to a side surface, a back surface, or an upper surface of the image display device 200, or disposed at a position distant from the image display device 200. Further, the motion detector 60 and the color illuminance sensor 50 may be positioned separately from each other.

<2.1 Brightness of Screen in Each State>

FIG. 16 shows charts showing brightness of a screen in the first state to the fourth state when the light source 40 is made to emit slight light. More specifically, FIG. 16(a) shows the brightness of the screen in the first state to the fourth state before the source light is adjusted, and FIG. 16(b) shows the brightness of the screen in the first state to the fourth state after the source light is adjusted. As illustrated in FIG. 16(a), when the light source 40 is made to emit slight light, the screen in the first state becomes slightly bright, and the screen in the second state becomes less bright than the screen in the first state. By adjusting the source light in this state, it is possible to make the screen in the first state brighter, as illustrated in FIG. 16(b). As described above, by adjusting the source light by making the light source 40 to emit slight light, the brightness of the screen in the first state becomes brighter within the range in which the expression (1) is satisfied, and thus visibility of an image is improved.

<2.2 Effect>

According to this embodiment, the light source 40 is turned off when no viewer is nearby, and the light source 40 is made to emit slight light when the motion detector 60 detects the viewer. In this manner, only when there is any viewer nearby, the differences of the chromaticity and the color temperature of the background that is transmitted through the liquid crystal panel 30 are adjusted, or the luminance of the source light is adjusted. With this, it is possible to reduce power consumption of the image display device.

3. Third Embodiment

Figure 17:
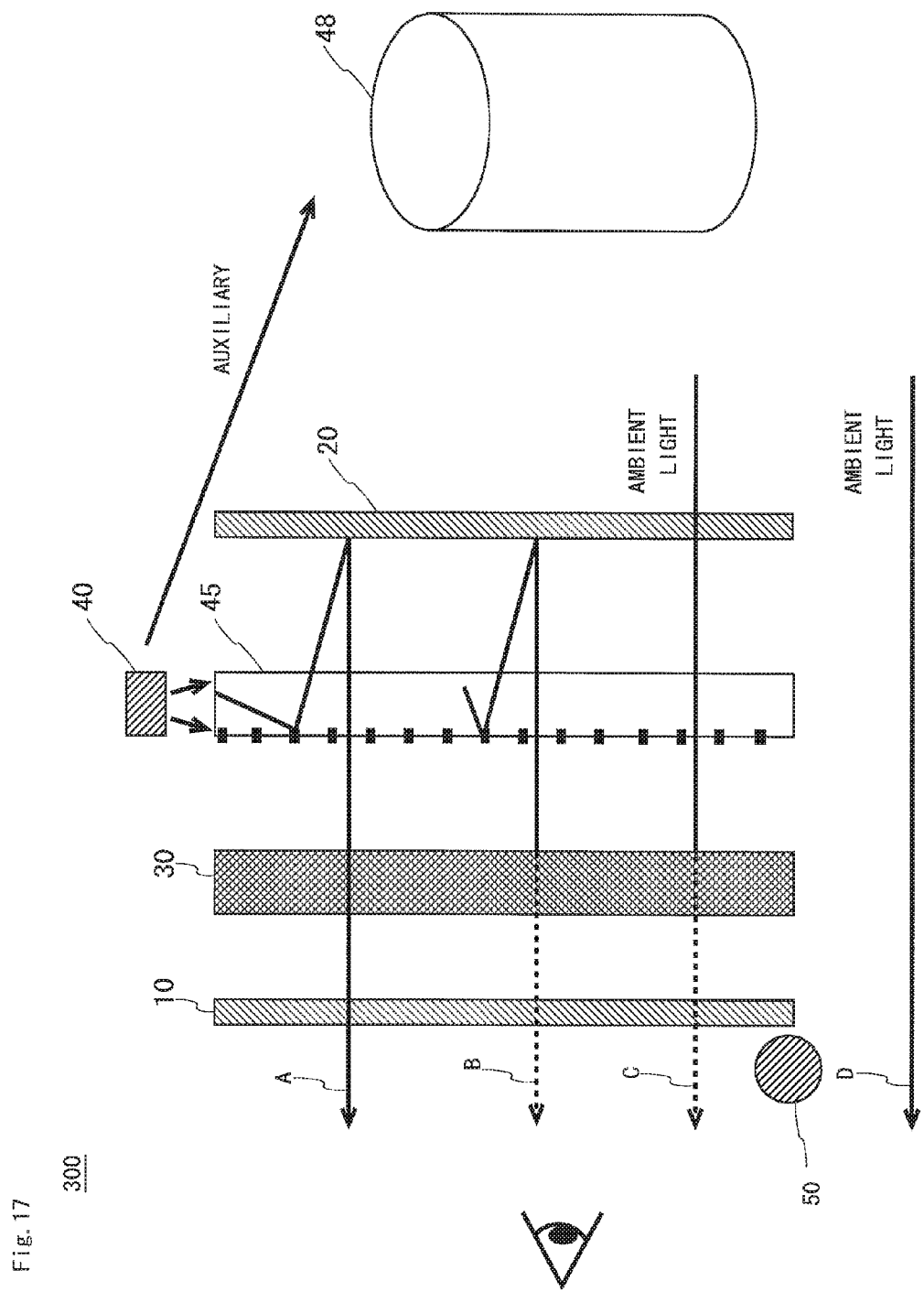
FIG. 17 is a diagram illustrating transmission paths of source light and ambient light in a display of an image display device according to a third embodiment of the present invention, in the first state to the fourth state shown in FIG. 7 through FIG. 10.

FIG. 17 is a diagram illustrating transmission paths of source light and ambient light in each state in a display of an image display device 300 according to a third embodiment of the present invention. As illustrated in FIG. 17, the image display device 300 according to this embodiment has the same configuration as the image display device 100 according to the first embodiment, other than that the light from the light source 40 is utilized as auxiliary light. Therefore, like components are denoted by like reference numerals and descriptions of those components will be omitted. Further, as a first state to a fourth state are the same as those in the first embodiment, these states are denoted by like reference numerals and descriptions of the states will be omitted.

Unlike the image display device 100 according to the first embodiment, the image display device 300 according to this embodiment is configured such that the light emitted from the light source 40 attached to the light-guiding plate 45 not entirely enters the light-guiding plate 45, but a part of the light is directly applied as auxiliary light to an object (e.g., columnar object) 48 on the back side of the display. The light applied to the object 48 is reflected by the object 48, and applied to the reflection-type polarizing plate 20 from the back side as a part of the ambient light. As this increases the luminance of the ambient light and makes the screen in the fourth state brighter, the light source 40 may be driven so that the luminance of the source light becomes high within the range in which the expression (1) is satisfied. As a result, the viewer is able to visually recognize an image displayed in easily viewable brightness.

Here, in FIG. 17, the light source 40 that applies the auxiliary light to the object 48 on the back side is attached to an upper end of the light-guiding plate 45. However, the light source 40 may be attached to a lower end, a left end, or a right end of the light-guiding plate 45. Further, a number of the light source 40 attached to the light-guiding plate 45 may be more than one, and a plurality of light sources 40 may be provided. When the plurality of light sources 40 are to be attached, the light sources 40 may be attached to the same end or different ends of the light-guiding plate 45. Attaching the plurality of light sources 40 increases the luminance of the auxiliary light by the number of the light sources, and therefore the luminance of the light from the backlight may also be increased based on the expression (1). With this, the viewer is able to visually recognize an image displayed in further easily viewable brightness.

4. Fourth Embodiment

Figure 18:
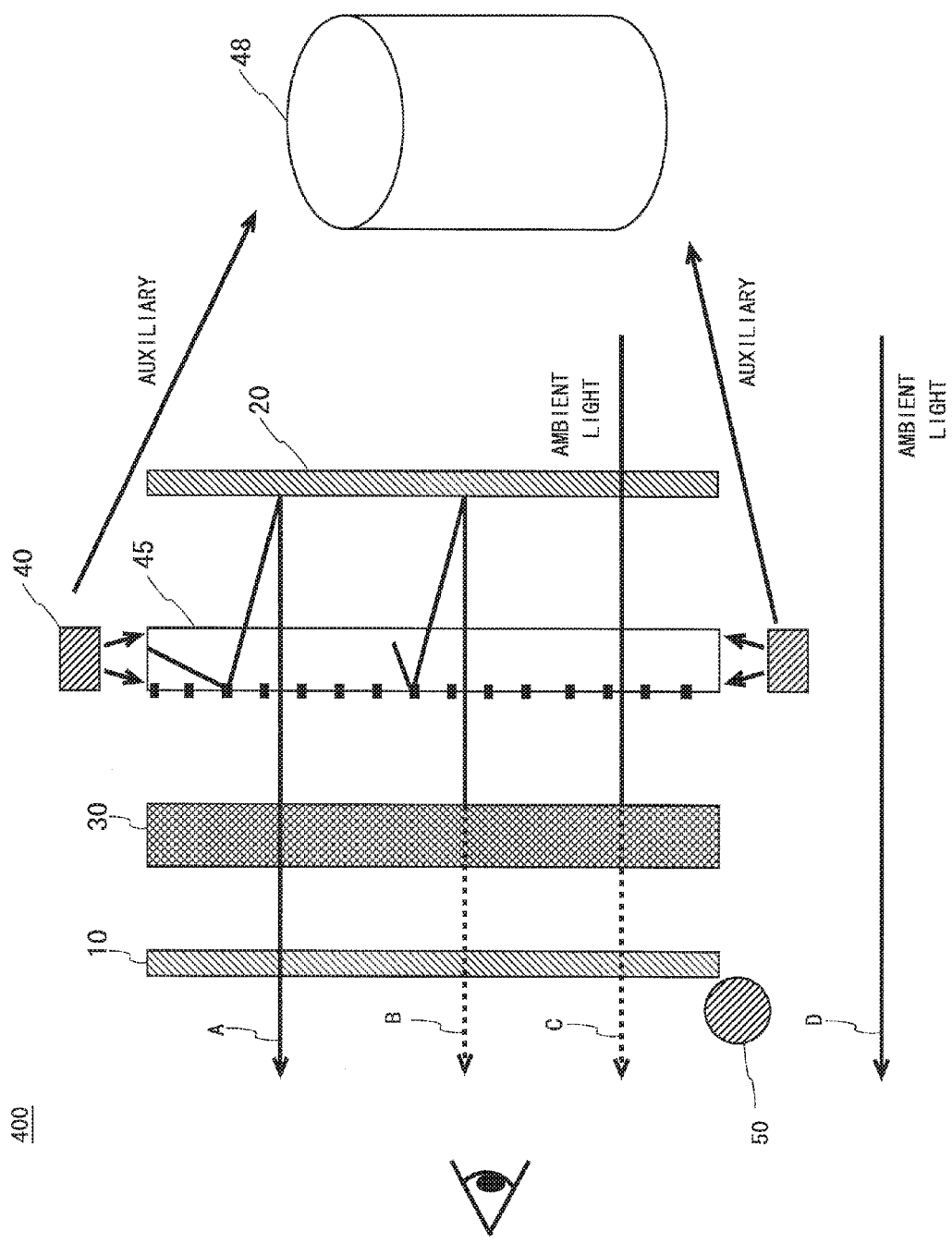
FIG. 18 is a diagram illustrating transmission paths of source light and ambient light in a display of an image display device according to a fourth embodiment of the present invention, in the first state to the fourth state shown in FIG. 7 through FIG. 10.

FIG. 18 is a diagram illustrating transmission paths of source light and ambient light in each state in a display of an image display device 400 according to a fourth embodiment of the present invention. As illustrated in FIG. 18, the image display device 400 according to this embodiment has the same configuration as the image display device 300 according to the third embodiment, other than that arrangement of the light sources 40. Therefore, like components are denoted by like reference numerals and descriptions of those components will be omitted. Further, as a first state to a fourth state are the same as those in the first embodiment, these states are denoted by like reference numerals and descriptions of the states will be omitted.

Similarly to the image display device 300 according to the third embodiment, the image display device 400 according to the fourth embodiment is configured such that the light emitted from the light sources 40 attached to the light-guiding plate 45 not only enters the light-guiding plate 45, but a part of the light is applied to the object 48 on the back side of the image display device 400. However, unlike the third embodiment, the plurality of light sources 40 are attached so that the auxiliary light is evenly applied to the object 48. FIG. 19 shows diagrams each illustrating the light-guiding plate 45 to which the light sources 40 are attached. More specifically, FIG. 19(a) shows the light-guiding plate 45 having the light sources 40 respectively attached to the left end and the right end, FIG. 19(b) shows the light-guiding plate 45 having the light sources 40 respectively attached to the upper end and the lower end, and FIG. 19(c) shows the light-guiding plate 45 having the light sources 40 respectively attached to the left end, the right end, the upper end, and the lower end. In a case as illustrated in FIG. 19(a), the light sources 40 are disposed on the left end and the right end of the light-guiding plate 45 so as to face each other. Therefore, the auxiliary light emitted from the light sources 40 is evenly applied to the object 48 on the back side. With this, the ambient light including the auxiliary light reflected by the object 48 becomes even.

Further, as illustrated in FIG. 19(b), in a case in which the light sources 40 are disposed on the upper end and the lower end, and the left end and the right end of the light-guiding plate 45 so that the light sources on the opposing ends face each other, the auxiliary light emitted from the light sources 40 is also evenly applied to the object 48 on the back side. With this, the ambient light including the auxiliary light reflected by the object 48 becomes more even than the case illustrated in FIG. 19(a). Further, as illustrated in FIG. 19(c), the light sources 40 may be disposed on the left end and the right end, and on the upper end. In this case, the number of the light sources 40 is an odd number, and among these light sources 40, ones on the left end and the right end are at positions facing each other. Further, the light source 40 on the upper end is bilaterally facing centering its center.

In this manner, by arranging the plurality of light sources 40 on the ends of the light-guiding plate 45 so that one of the light sources 40 on one end faces another on the other end, the auxiliary light that is evenly applied to the object on the back side is reflected, and applied to the reflection-type polarizing plate 20 from the back side as apart of the ambient light. At this time, as the auxiliary light that is evenly applied is reflected as light with even brightness, the luminance of the ambient light transmitted through the liquid crystal panel 30 also becomes even, and the viewer is able to visually recognize the object 48 shown with even brightness.

5. Fifth Embodiment

Figure 20:
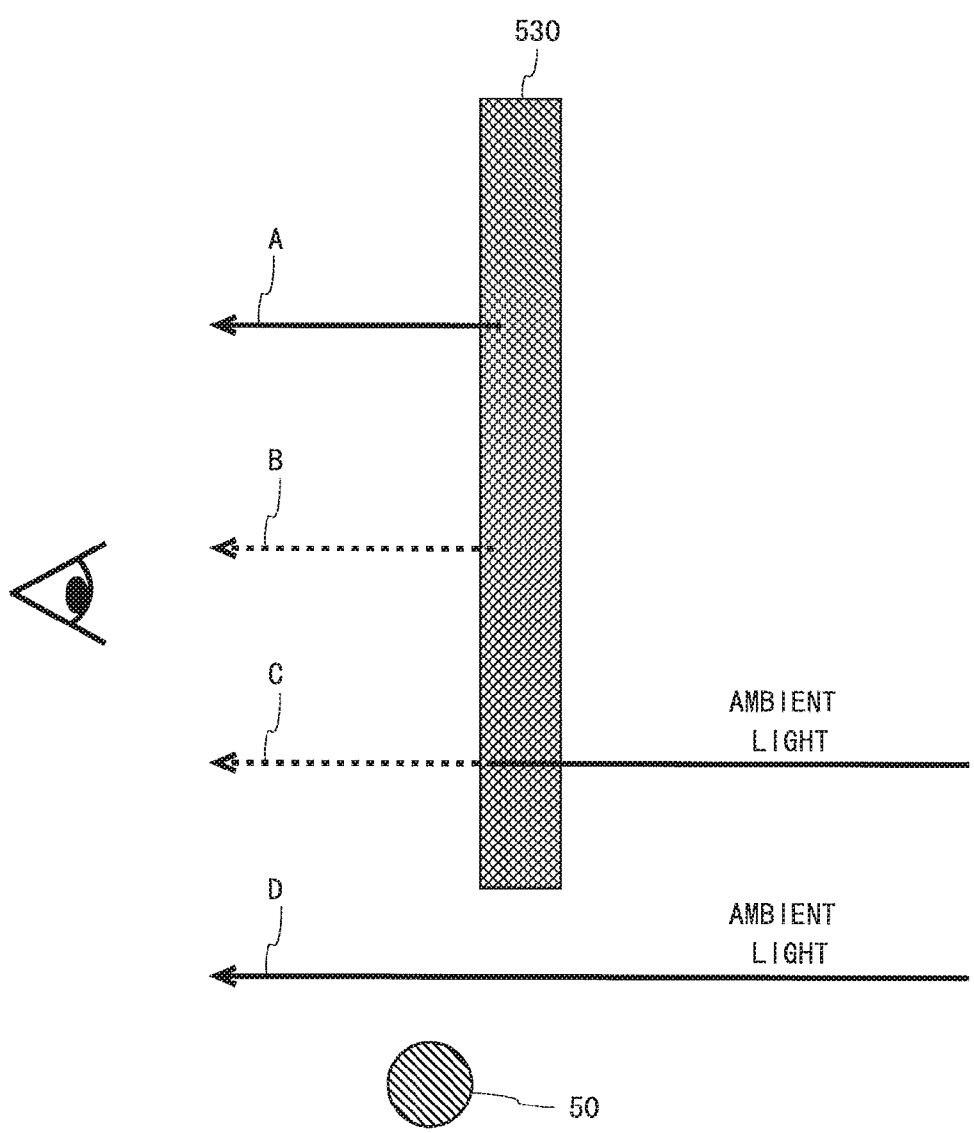
FIG. 20 is a diagram illustrating transmission paths of source light and ambient light in a display of an image display device according to a fifth embodiment of the present invention, in the first state to the fourth state shown in FIG. 7 through FIG. 10.

FIG. 20 is a diagram illustrating transmission paths of source light and ambient light in each state in a display of an image display device 500 according to a fifth embodiment of the present invention. As illustrated in FIG. 20, the image display device 500 includes an organic EL panel 530. Unlike the liquid crystal panel 30, the organic EL panel 530 is a self-emissive panel. Therefore, each pixel in the organic EL panel 530 emits light and the emitted light may not escape to a different pixel. Therefore, out of four states including the first state to the fourth state described in the first embodiment, the second state does not exist.

While not illustrated, the organic EL panel 530 includes an emission layer, an electron-transport layer, a transparent electrode layer, and the like. In the organic EL panel 530, the emission layer emits light for each pixel when a voltage corresponding to an image signal is applied to the emission layer, and an image corresponding to the image signal is displayed on a screen. Further, ambient light entering from a back side of the organic EL panel 530 may be transmitted through the emission layer, the electron-transport layer, the transparent electrode layer, and the like, but chromaticity and a color temperature of the ambient light are different from chromaticity and a color temperature prior to incident. Here, the organic EL panel 530 is referred to as an "image display unit" in some cases.

Similarly to the image display device 100 according to the first embodiment, the organic EL panel 530 of the image display device 500 is provided with the color illuminance sensor 50 for measuring illuminance, chromaticity, and a color temperature of the ambient light. As described above, the image display device 500 does not include a second state. Therefore, in place of the second state, a voltage lower than the voltage applied to the pixels to display an image is applied to emit weak light. The organic EL panel 530 is driven so that chromaticity and a color temperature in this state are approximated to the chromaticity and the color temperature of the ambient light measured by the color illuminance sensor 50 to adjust chromaticity and a color temperature of source light. This gives the viewer has a higher sense of transparency when visually recognizing background, in the same manner as the image display device 100 of the first embodiment. Further, by having brightness of the screen in the first state be approximated to the brightness in the fourth state within the range in which the expression (1) is satisfied, the viewer is able to visually recognize an image displayed with easily viewable brightness.

It should be noted that the color illuminance sensor 50 may be attached at a position similar to the case in the first embodiment. Further, similarly to the second embodiment, the motion detector 60 is further provided, and when the motion detector 60 detects the viewer near the image display device, a low voltage is applied to the pixels of the organic EL panel 530 so that slight light is emitted. In this case, similarly to the second embodiment, by emitting light so that the chromaticity and the color temperature are approximated to the chromaticity and the color temperature of the ambient light measured by the color illuminance sensor 50, the viewer is able to visually recognize the background in a state in which transparency seems to be increased. Further, by having brightness of the screen in the first state be approximated to the brightness in the fourth state within the range in which the expression (1) is satisfied, the viewer is able to visually recognize an image displayed with easily viewable brightness.

<5.1 Effect>

According to this embodiment, it is possible for an image display device having an organic EL panel to provide the same effects as the image display device according to the first to the fourth embodiment.

INDUSTRIAL APPLICABILITY

The present invention may be applied to an image display device having a see-through-type display through which background can be seen.

DESCRIPTION OF REFERENCE CHARACTERS

10: absorption-type polarizing plate
20: reflection-type polarizing plate
30: liquid crystal panel
40: light source (edge light)
45: light-guiding plate
50: color illuminance sensor
60: motion detector
70: black cloth
100: image display device
110: display
111: display control circuit
112: memory
113: scanning signal line drive circuit
114: data signal line drive circuit
530: organic EL panel

The invention claimed is:

1. An image display device having a display capable of providing transparent display through which background can be seen, the device comprising:
a light source configured to emit source light;
an image display unit configured to display an image by transmitting the source light emitted from the light source based on an image signal externally supplied to display the image, and capable of displaying background by transmitting ambient light entering from a back side;
an ambient light measuring sensor attached to the display, and capable of at least measuring chromaticity and a color temperature of the ambient light; and
a drive control unit configured to drive the image display unit, wherein
the drive control unit controls the image display unit such that chromaticity and a color temperature of source light are respectively approximated to the chromaticity and the color temperature of the ambient light that have been measured by the ambient light measuring sensor, the source light being transmitted through a region through which the ambient light is originally to be transmitted and having luminance lower than luminance of source light emitted from the light source when the image is displayed;
wherein the ambient light measuring sensor is further capable of measuring illuminance of the ambient light, and
the drive control unit controls the image display unit such that luminance of the source light in a second state is approximated to luminance of the ambient light in a fourth state within a range in which luminance in a first state, the luminance in the second state, luminance in a third state, and the luminance in the fourth state satisfy an expression (1), the first state being for transmitting only the source light, the second state being for transmitting a part of the source light through the region through which only the ambient light is originally to be transmitted, the third state being for transmitting only the ambient light, and the fourth state being for allowing direct visual recognition of the ambient light, where $$\text{fourth state} > \text{first state} > (\text{second state} + \text{third state}) \quad (1).$$

2. The image display device according to claim 1, further comprising a motion detector capable of detecting presence of a viewer, wherein
the drive control unit turns off the light source when the motion detector does not detect presence of the viewer, and turns on the light source to be in a slight light emission state when the motion detector detects presence of the viewer.

3. The image display device according to claim 1, wherein
the image display unit includes: a liquid crystal panel; an absorption-type polarizing plate disposed on a front side of the liquid crystal panel; and a reflection-type polarizing plate disposed on a back side of the liquid crystal panel,
the light source is a light-guiding plate disposed between the liquid crystal panel and the reflection-type polarizing plate, and having an edge light attached on an end of the light-guiding plate,
the light-guiding plate irradiates the reflection-type polarizing plate with source light emitted from the light source,
the reflection-type polarizing plate reflects a polarization component of the source light having a polarizing direction identical to a direction of a reflection axis, and transmits a polarization component of the ambient light having a polarizing direction identical to a direction of a transmission axis to irradiate the liquid crystal panel with the transmitted light, and
the drive control unit drives the liquid crystal panel by correcting a constant calculated considering components of the image display unit such that chromaticity and a color temperature of the source light in the second state are respectively approximated to chromaticity and a color temperature of the ambient light in the fourth state.

4. The image display device according to claim 3, wherein the drive control unit drives the light source by correcting a constant calculated considering the components of the image display unit such that the luminance of the source light in the first state is approximated to the luminance of the ambient light of the fourth state within the range in which the expression (1) is satisfied.

5. The image display device according to claim 3, wherein directions of transmission axes of the absorption-type polarizing plate, the liquid crystal panel, and the reflection-type polarizing plate are adjusted such that the ambient light entering the reflection-type polarizing plate from a back side is transmitted to a front side of the absorption-type polarizing plate when the absorption-type polarizing plate is viewed from the front side when the liquid crystal panel and the light source are in an off state.

6. The image display device according to claim 4, wherein the light-guiding plate is provided with one or more edge lights, and the one or more edge lights emit source light into the light-guiding plate, and irradiate an object positioned on the back side of the image display device with a part of the source light.

7. The image display device according to claim 4, wherein the light-guiding plate is provided with a plurality of edge lights, and the plurality of edge lights are disposed on ends of the light-guiding plate so as to face each other, and the plurality of edge lights emit source light into the light-guiding plate, and irradiate an object positioned on the back side of the image display device with a part of the source light.

8. The image display device according to claim 1, wherein the image display unit is an organic EL panel having a plurality of pixels each emitting light of a light intensity according to the image signal, and the drive control unit drives the organic EL panel by correcting a constant calculated considering components of the organic EL panel such that chromaticity and a color temperature of source light are respectively approximated to the chromaticity and the color temperature of the ambient light that have been measured by the ambient light measuring sensor, the source light being transmitted through the pixels through which the ambient light is originally to be transmitted and having luminance lower than luminance of source light emitted from the pixels when the image is displayed.

9. The image display device according to claim 8, wherein the drive control unit drives the light source by correcting a constant calculated considering the components of the organic EL panel such that the luminance of the source light in the first state is approximated to the luminance of the ambient light of the fourth state within the range in which the expression (1) is satisfied.

* * * * *